(12) United States Patent
Kato

(10) Patent No.: US 9,159,379 B2
(45) Date of Patent: Oct. 13, 2015

(54) SWITCHING CIRCUIT AND SEMICONDUCTOR MEMORY DEVICE

(71) Applicant: FUJITSU SEMICONDUCTOR LIMITED, Yokohama-shi, Kanagawa (JP)

(72) Inventor: Kenta Kato, Seto (JP)

(73) Assignee: SOCIONEXT INC., Yokohama (JP)

(*) Notice: Subject to any disclaimer, the term of this patent is extended or adjusted under 35 U.S.C. 154(b) by 0 days.

(21) Appl. No.: 14/140,213

(22) Filed: Dec. 24, 2013

(65) Prior Publication Data

US 2014/0293716 A1    Oct. 2, 2014

(30) Foreign Application Priority Data

Mar. 26, 2013  (JP) ................. 2013-064937

(51) Int. Cl.
| | |
|---|---|
| G11C 5/00 | (2006.01) |
| G11C 5/14 | (2006.01) |
| H03K 19/00 | (2006.01) |
| H03K 19/0175 | (2006.01) |
| G11C 7/12 | (2006.01) |
| G11C 8/08 | (2006.01) |
| G11C 16/12 | (2006.01) |
| H01L 27/088 | (2006.01) |

(52) U.S. Cl.
CPC  *G11C 5/147* (2013.01); *G11C 7/12* (2013.01); *G11C 8/08* (2013.01); *G11C 16/12* (2013.01); *H03K 19/00* (2013.01); *H03K 19/017509* (2013.01); *H01L 27/088* (2013.01)

(58) Field of Classification Search
CPC ....................... G11C 5/14; G11C 7/12
USPC ............................. 365/189.11, 226
See application file for complete search history.

(56) References Cited

U.S. PATENT DOCUMENTS

| | | | |
|---|---|---|---|
| 6,574,152 B1* | 6/2003 | Lee et al. ............... 365/189.11 |
| 7,372,301 B2* | 5/2008 | Fukuoka et al. ............ 326/81 |
| 7,521,987 B1* | 4/2009 | Cullen et al. ............ 327/530 |
| 8,004,340 B2* | 8/2011 | Guo et al. ............... 327/333 |
| 2002/0024873 A1* | 2/2002 | Tomishima et al. ..... 365/230.06 |
| 2004/0036363 A1* | 2/2004 | Sarig et al. ............. 307/125 |
| 2004/0052249 A1* | 3/2004 | Fukuoka et al. .......... 370/362 |
| 2004/0169543 A1* | 9/2004 | Doutreloigne et al. ..... 327/333 |
| 2006/0214722 A1 | 9/2006 | Hirose et al. |
| 2007/0014061 A1* | 1/2007 | Chang et al. ............. 361/56 |
| 2007/0194834 A1* | 8/2007 | Sohara et al. ............ 327/536 |
| 2007/0262810 A1* | 11/2007 | Lee et al. ............... 327/534 |

(Continued)

FOREIGN PATENT DOCUMENTS

| | | |
|---|---|---|
| JP | 2006-311507 A | 11/2006 |
| JP | 2008-067369 A | 3/2008 |

*Primary Examiner* — Michael Tran
(74) *Attorney, Agent, or Firm* — Arent Fox LLP

(57) ABSTRACT

A switching circuit includes a first well and a second well formed in a semiconductor substrate; a first transistor being connected with a first node at one end, and the first transistor being formed in the first well; a second transistor being connected with another end of the first node at one end, and connected with a second node at another end, and the second transistor being formed in the second well; and a potential control circuit that connects the second well with the first node during a predetermined period including a period for the first transistor and the second transistor to transition from off to on in a state where potential of the second node is lower than potential of the first node, and connects the second well with the second node after the predetermined period.

15 Claims, 17 Drawing Sheets

(56) References Cited

U.S. PATENT DOCUMENTS

| | | |
|---|---|---|
| 2008/0048500 A1 | 2/2008 | Kihara et al. |
| 2009/0009916 A1* | 1/2009 | Ker et al. ........................ 361/56 |
| 2010/0148818 A1* | 6/2010 | Deutscher et al. .............. 326/34 |
| 2012/0038003 A1* | 2/2012 | Kawachi ....................... 257/371 |
| 2012/0242372 A1* | 9/2012 | Kollmann ....................... 327/77 |
| 2013/0249001 A1* | 9/2013 | Willmeroth et al. .......... 257/341 |

* cited by examiner

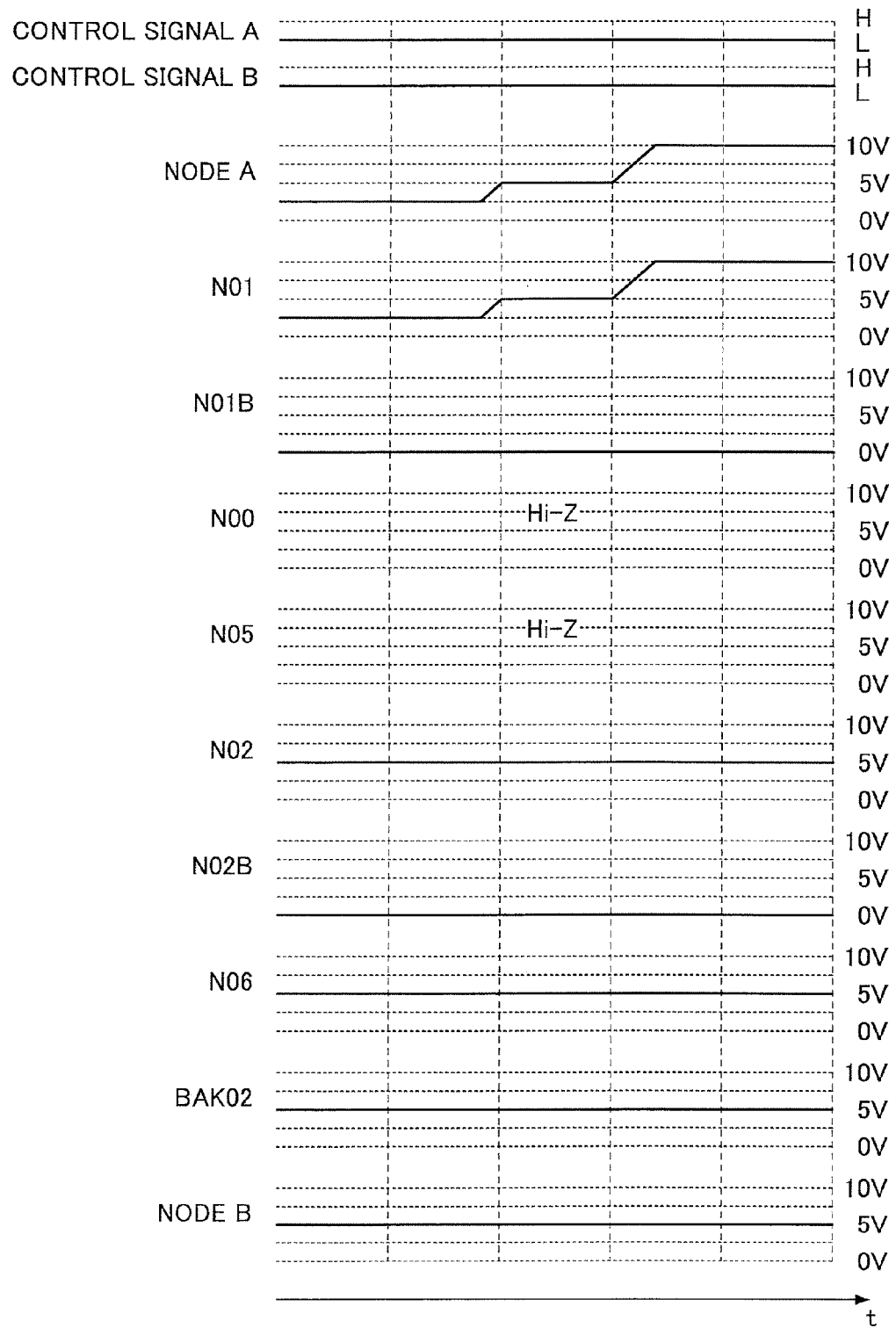

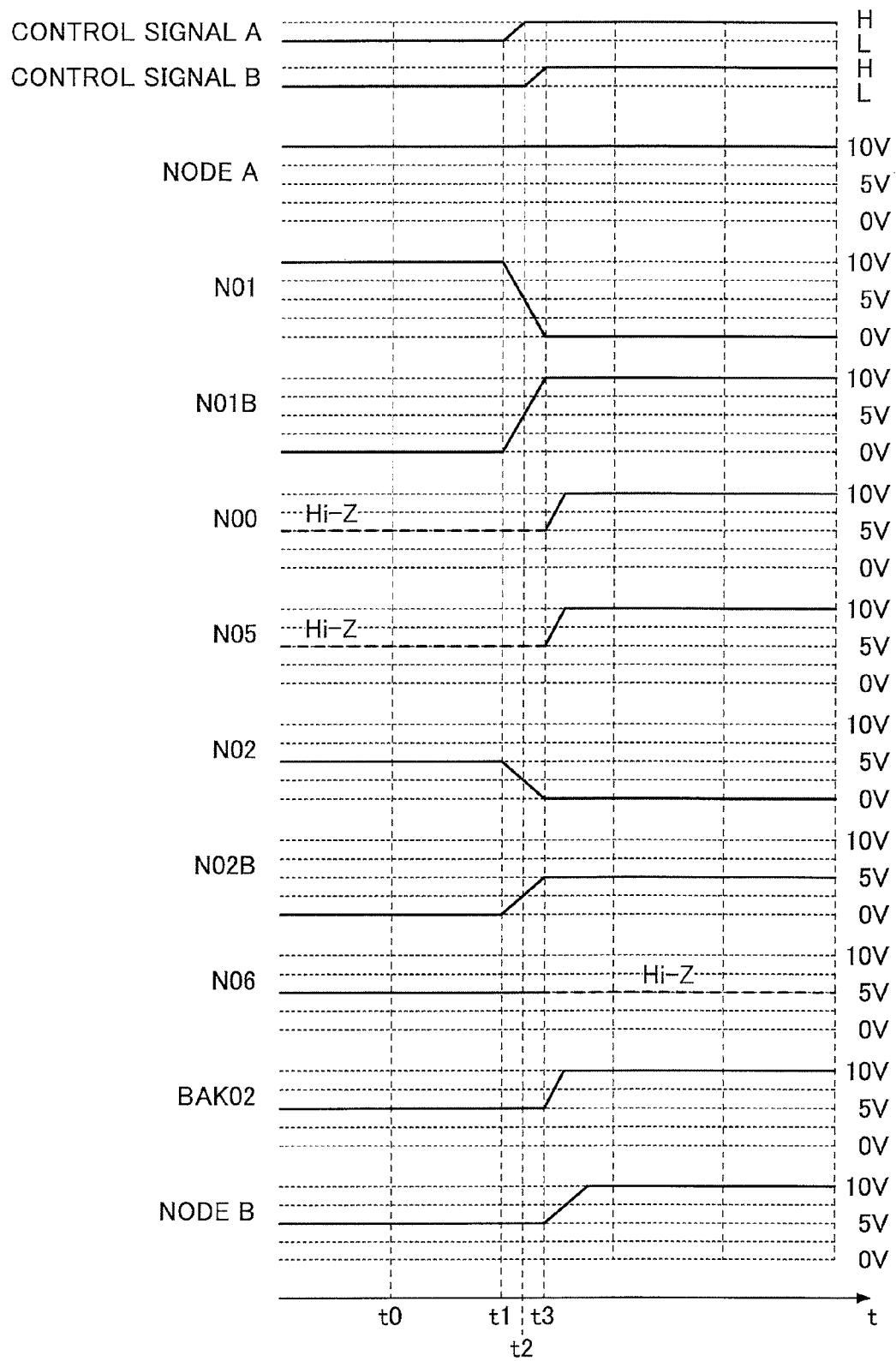

SWITCHING CIRCUIT AND SEMICONDUCTOR MEMORY DEVICE

CROSS-REFERENCE TO RELATED APPLICATIONS

This application is based upon and claims the benefit of priority of the prior Japanese Priority Application No. 2013-064937 filed on Mar. 26, 2013, the entire contents of which are hereby incorporated by reference.

FIELD

The disclosures herein generally relate to a switching circuit and a semiconductor memory device.

BACKGROUND

Conventionally, there is a switching device that includes multiple input terminals connected with multiple voltage sources, respectively, and an output terminal connected with a power-supplied device and selectively switches connections between the multiple voltage sources and the power-supplied device.

In the switching device, each switching path that connects each of the multiple voltage sources and the power-supplied device includes a first and a second enhancement-type P-channel MOS transistors. The switching device connects the drain electrode of the first enhancement-type P-channel MOS transistor with the source electrode of the second enhancement-type P-channel MOS transistor.

Also, the switching device connects the gate electrode of the first enhancement-type P-channel MOS transistor with the output terminal, and connects the gate electrode of the second enhancement-type P-channel MOS transistor with the input terminal (see, for example, Patent Document 1).

RELATED-ART DOCUMENTS

Patent Documents

[Patent Document 1] Japanese Laid-open Patent Publication No. 2008-067369

Incidentally, the conventional switching device has a risk of generation of a latchup because a forward bias is generated in a transistor connected at a lower-potential terminal when the first and second enhancement-type P-channel MOS transistors become on during a selective switching of connection between the voltage sources and the power-supplied device.

SUMMARY

According to at least one embodiment of the present invention, a switching circuit includes a first well and a second well formed in a semiconductor substrate; a first transistor being connected with a first node at one end, and the first transistor being formed in the first well; a second transistor being connected with another end of the first node at one end, and connected with a second node at another end, and the second transistor being formed in the second well; and a potential control circuit that connects the second well with the first node during a predetermined period including a period for the first transistor and the second transistor to transition from off to on in a state where the potential of the second node is lower than the potential of the first node, and connects the second well with the second node after the predetermined period.

The object and advantages of the embodiment will be realized and attained by means of the elements and combinations particularly pointed out in the claims. It is to be understood that both the foregoing general description and the following detailed description are exemplary and explanatory and are not restrictive of the invention as claimed.

BRIEF DESCRIPTION OF DRAWINGS

FIGS. 7A-7B are schematic views illustrating operation of the switching circuit 100 according to the first embodiment;

FIGS. 8A-8B are schematic views illustrating operation of the switching circuit 100 according to the first embodiment;

DESCRIPTION OF EMBODIMENTS

In the following, embodiments of the present invention will be described with reference to the drawings. According to at least one embodiment of the present invention, it is possible to provide a switching circuit and a semiconductor memory device that suppresses a latchup. Before describing a switching circuit and a semiconductor memory device according to embodiments of the present invention, first, a conventional switching circuit 1 and its operation will be described using FIGS. 1-3.

Figure 1:
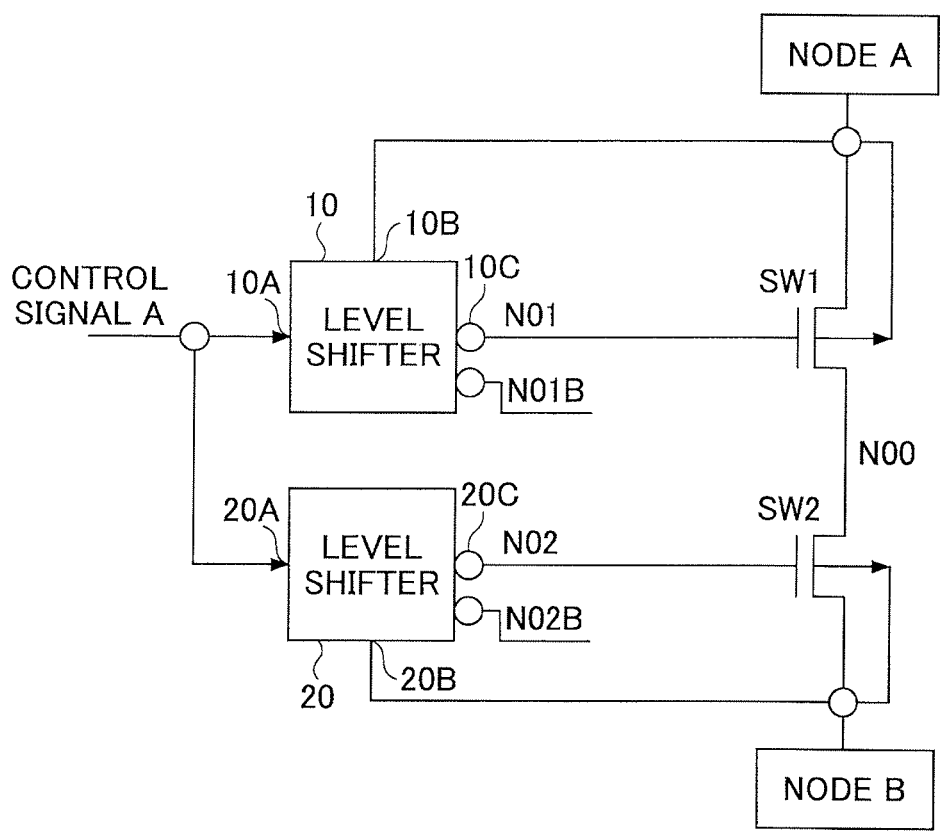
FIG. 1 is a schematic view illustrating a conventional switching circuit 1.

FIG. 1 is a schematic view illustrating the conventional switching circuit 1.

The switching circuit 1 includes transistors SW1-SW2 and level shifters 10-20.

The transistors SW1-SW2 are p-type MOSFET (Metal Oxide Semiconductor Field Effect Transistor) used as switching elements. The transistors SW1-SW2 are connected between a node A and a node B in order.

The source of the transistor SW1 is connected with the node A, the drain is connected with the source of the transistor SW2, and the gate is connected with the output terminal 10C of the level shifter 10. Here, a potential point that connects the gate of the transistor SW1 with the output terminal 100 of the level shifter 10 is called a "node N01". Here, the source and the well of the transistor SW1 are connected with each other.

The source of the transistor SW2 is connected with the drain of the transistor SW1, the drain is connected with the node B, and the gate is connected with the output terminal 20C of the level shifter 20. Here, a potential point that connects the gate of the transistor SW2 with the output terminal 20C of the level shifter 20 is called a "node N02". Here, the drain and the well of the transistor SW2 are connected with each other.

Also, here, a potential point that connects the drain of the transistor SW1 with the source of the transistor SW2 is called a "node N02".

Here, the switching circuit 1 can be used, for example, in a semiconductor memory device such as a flash memory. In such a case, it is assumed that the node A is a potential point where electric power is supplied from the outside of the semiconductor memory device, and the node B is a potential point in the semiconductor memory device.

The level shifter 10 is a CMOS differential-output level shifter. The level shifter 10 has an input terminal 10A that receives a control signal A as input, a voltage input terminal 10B that is connected with the node A, and a pair of output terminals 100 where one of them, or the positive terminal, is connected with the gate of the transistor SW1 via the node N01.

The level shifter 10 is a circuit that sets a voltage value output from the output terminal 100 based on the control signal A. The level shifter 10 outputs a voltage equivalent to the voltage input into the voltage input terminal 10B from the positive terminal of the output terminals 100 to the node N01 if the level of the control signal A is at L (Low) level, or outputs the voltage at ground level (0 V) from the positive terminal of the output terminals 100 to the node N01 if the level of the control signal A is at H (High) level.

Here, the negative terminal of the pair of output terminals 100 outputs a voltage whose phase is inverted to that of the positive terminal to node N01B. However, the negative terminal is not used here. Therefore, the level shifter 10 may be a single-end type. Also, the level shifter 10 may be a level converter that operates in substantially the same way.

The level shifter 20 is a CMOS differential-output level shifter. The level shifter 20 has an input terminal 20A that receives the control signal A as input, a voltage input terminal 20B that is connected with the node B, and a pair of output terminals 20C where one of them, or the positive terminal, is connected with the gate of the transistor SW2 via the node N02.

The level shifter 20 is a circuit that sets a voltage value output from the output terminal 20C based on the control signal A. The level shifter 20 outputs a voltage equivalent to the voltage input into the voltage input terminal 20B from the positive terminal of the output terminals 20C to the node N01 if the level of the control signal A is at L (Low) level, or outputs the voltage at ground level (0 V) from the positive terminal of the output terminals 20C to the node N01 if the level of the control signal A is at H (High) level.

Here, the negative terminal of the pair of output terminals 20C outputs a voltage whose phase is inverted to that of the positive terminal to node N02B. However, the negative terminal is not used here. Therefore, the level shifter 20 may be a single-end type. Also, the level shifter 20 may be a level converter that operates in substantially the same way.

The switching circuit 1 turns the transistors SW1-SW2 on and off by controlling the output voltages of the level shifters 10-20 based on the control signal A, to supply the voltage of the node A to the node B.

Here, as for the potential of the nodes A and B, the potential of the node A is in a state higher than the potential of the node B if both of the transistors SW1-SW2 are set on in the switching circuit 1. Also, the potential of the nodes A and B take arbitrary values if both of the transistors SW1-SW2 are set off in the switching circuit 1.

Here, in the following, there may be cases where the switching circuit 1 is referred to as in an on state if both of the transistors SW1-SW2 are on, and is referred to as in an off state if both of the transistors SW1-SW2 are off.

Next, operation of the switching circuit 1 will be described using FIGS. 2A-2B and 3A-3B.

Figure 2A:
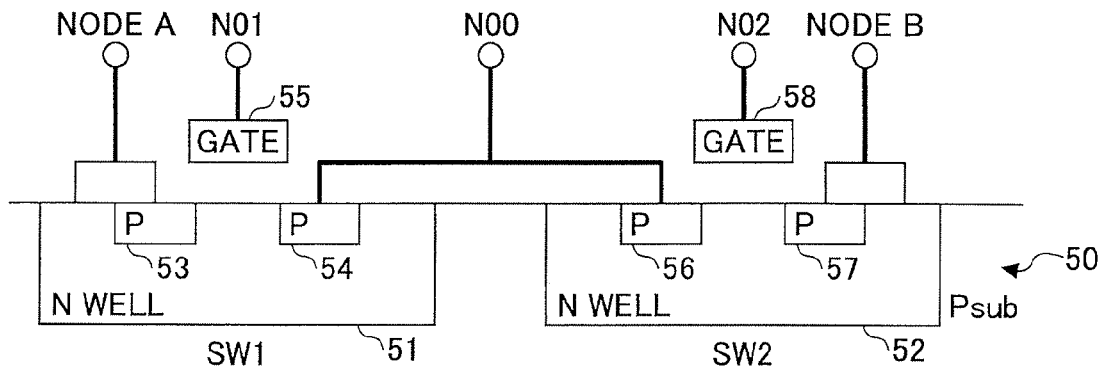
FIGS. 2A-2B are schematic views illustrating operation of transistors SW1 and SW2 in the switching circuit 1.
Figure 2B:
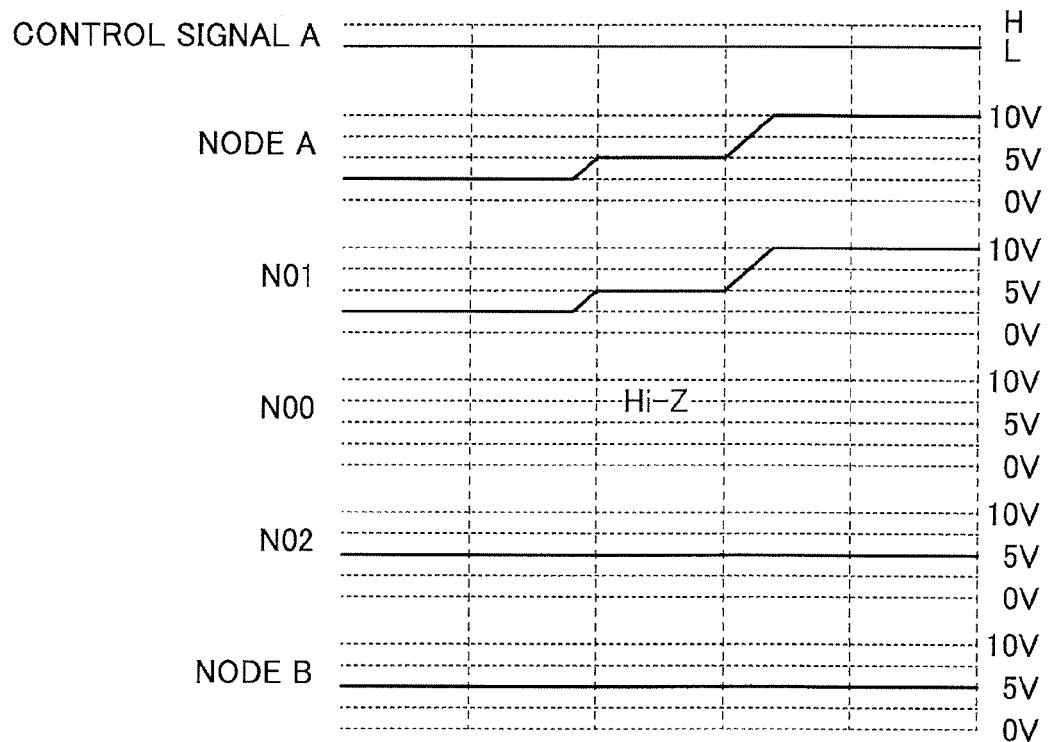
Figure 3A:
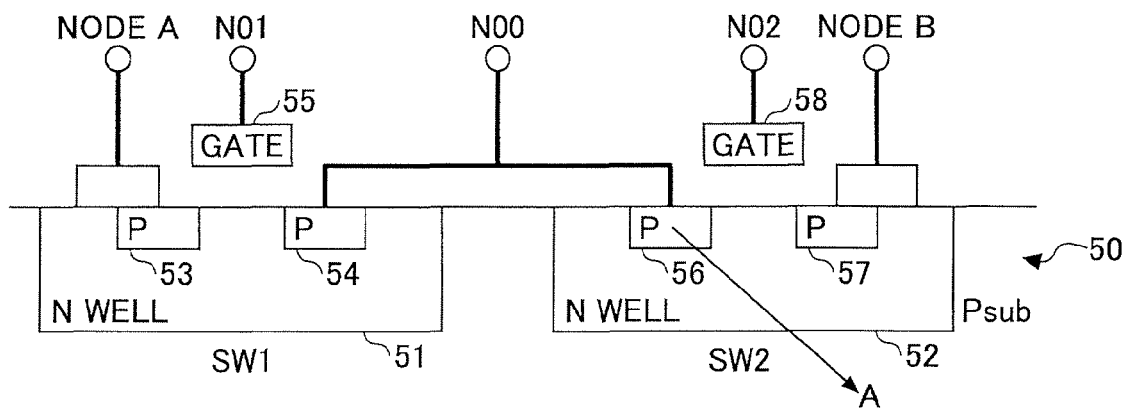
FIGS. 3A-3B are schematic views illustrating operation of the transistors SW1 and SW2 in the switching circuit 1.
Figure 3B:
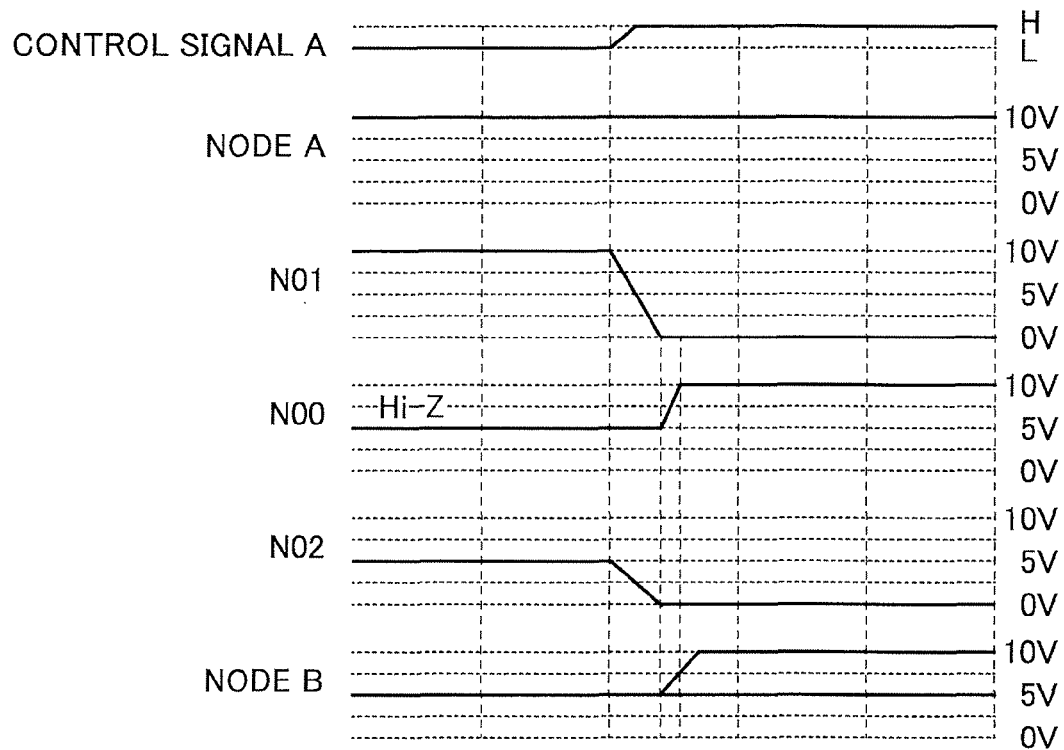

FIGS. 2A-2B and 3A-3B are schematic views illustrating operation of the transistors SW1 and SW2 in the switching circuit 1. FIGS. 2A-2B illustrate operation when the switching circuit 1 is off and FIGS. 3A-3B illustrate operation when the switching circuit 1 is on. Also, FIG. 2A and FIG. 3A illustrate cross sections of the transistors SW1-SW2 in the switching circuit 1 and, FIG. 2B and FIG. 3B illustrate timing charts to represent the operation of the switching circuit 1, respectively.

First, as illustrated in FIG. 2A, the transistors SW1-SW2 are formed in N wells 51-52, respectively, formed in a p-type substrate (Psub) 50. The transistor SW1 includes a source 53, a drain 54, and a gate 55. The transistor SW1 includes a source 56, a drain 57, and a gate 58.

The source 53 and drain 54 are p-type regions formed in the N well 51, and the gate 55 is disposed above the source 53 and drain 54 via a gate insulation film.

The source 56 and drain 57 are p-type regions formed in the N well 52, and the gate 58 is disposed above the source 56 and drain 57 via a gate insulation film.

The node A illustrated in FIG. 1 is connected with the N well 51 and the source 53, the node N00 is connected with the drain 54 and the source 56, and the node N01 is connected with the gate 55.

Also, the node B is connected with the N well 52 and the drain 57, and the node N02 is connected with the gate 58.

As illustrated in FIG. 2B, if the control signal A is at L level (0 V), the output of the level shifters 10-20 (see FIG. 1) becomes H level, hence the transistors SW1-SW2 become off.

Therefore, if the potential of the node A changes to take 0 V, 5 V, and 10 V as illustrated in FIG. 2B, the voltage of the gate 55 changes similarly, and the potential of the node N01 also changes to take 0 V, 5 V, and 10 V.

Also, at this moment, as an example, the node B stably stays at 5 V, so does the voltage of the gate 55, hence the potential of the node N02 also stays at 5 V. Here, the potential of the node B may change arbitrarily, which is followed by the potential of the node N02.

As a result, the potential of the node N00 becomes undefined (Hi-Z). This is because the transistors SW1-SW2 are held in an off state regardless of values of the nodes A and B.

Next, a case will be described where the transistors SW1-SW2 turn on. Turning on the transistors SW1-SW2 corresponds to, for example, executing a write (PGM) operation in a READ state, for example, in a flash memory. Therefore, as illustrated in FIG. 3B, the nodes A and B take the potential of 10 V and 5 V, respectively.

As illustrated in FIG. 3B, if the control signal A is switched to H level, the output voltage of the level shifters 10-20 becomes L level, and the potential of the nodes N01-N02 becomes 0 V. At this moment, the node N01 falls down from 10 V to 0 V, the node N02 falls down from 5 V to 0 V. This makes the transistors SW1-SW2 become on.

At this moment, as a main path (path between the source and drain) of the transistors SW1-SW2 between the node A and the node B is in a conducting state, voltage is supplied from the node A to the node B, and the potential of the node B rises from 5 V to 10 V.

Here, comparing the node N00 with the node B, the node B is loaded with comparatively greater parasitic capacitance caused by the drain 57, the N well 52, the p-type substrate 50 and the like, whereas the node N00 is separated by the transistor SW2 from such parasitic capacitance. Therefore, the node N00 has a smaller load than the node B.

Therefore, as illustrated in FIG. 3B, if the potential of the nodes N01-N02 becomes 0 V, which turns on both of the transistors SW1-SW2, the potential of the node N00 rises faster than the potential of the node B. In other words, at this moment, the rise of the potential of the node B comes behind the rise of the node N00.

If the rise of the potential of the node B comes behind a rise of the node N00 in this way, a forward bias is applied between the source 56 (p region) and the N well 52 at the transistor SW2, which has lower potential among the transistors SW1-SW2, when transistors SW1-SW2 become on.

As a result of the applied forward bias, a parasitic bipolar transistor becomes on that is formed by a PNP junction of the source 56, the N well 52, and the p-type substrate 50, and a current flows to the p-type substrate 50 from the source 56 via the N well 52.

If the current flows to the p-type substrate 50 in this way, the potential of the p-type substrate 50 rises, which makes a parasitic bipolar transistor on that is formed by an NPN junction of the N well 51, the p-type substrate 50, and the N well 52, and a current flows to the N well 51 from the N well 52 via the p-type substrate 50.

Therefore, there is a risk of latchup generation that makes the switching circuit 1 uncontrollable.

To suppress a latchup, a solution may be considered that installs a guard ring around the transistor SW2. The guard ring is provided by forming a ring-shaped (in plane view) insulation layer around the N well 52 of the transistor SW2.

However, as the guard ring is disposed around the transistor SW2, a larger area is required for forming the switching circuit 1, which is not suitable for making it small.

Also, to suppress that the rise of the potential of the node B comes behind the rise of the node N00, one may consider to provide a power source circuit such as a charge pump or the like with the switching circuit 1 for complementing the current flowing between the source 56 of the transistor SW2 and the N well 52.

However, to add such a power source circuit, an even larger area is required for forming the switching circuit 1, which is not suitable for making it small, and it tends to be more notable if the amount of current supplied by the power source circuit needs to be increased.

Thus, a latchup is generated in the switching circuit 1 illustrated in FIG. 1 at the lower-potential transistor SW2 and its surroundings if the transistors SW1-SW2 become on for supplying a voltage from the node A to the lower-potential node B.

Also, adding a guard ring or a power source circuit to suppress a latchup is not suitable for making the circuit smaller because a larger area is required for forming the switching circuit 1.

In the following, a switching circuit and a semiconductor memory device will be described that suppress a latchup and are suitable to be made small according to embodiments of the present invention.

First Embodiment

Figure 4:
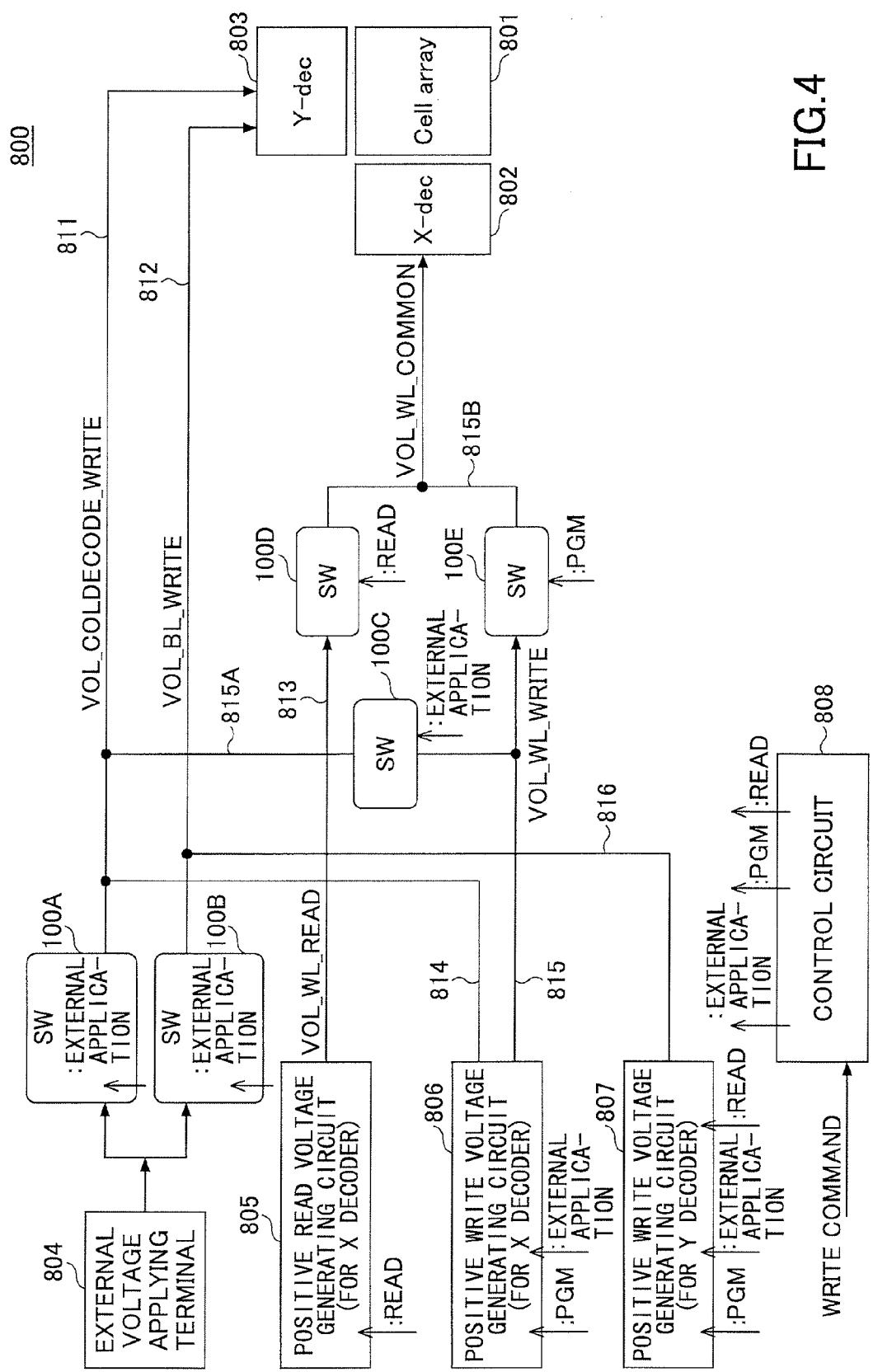
FIG. 4 is a schematic view illustrating a configuration of a flash memory 800 including a switching circuit 100 according to a first embodiment.

FIG. 4 is a schematic view illustrating a configuration of a flash memory 800 including a switching circuit 100 according to a first embodiment.

The flash memory 800 includes a cell array (Cell Array) 801, an X-decoder (X-dec) 802, a Y-decoder (Y-dec) 803, an external voltage applying terminal 804, a positive read voltage generating circuit (for X-decoder) 805, a positive write voltage generating circuit (for X-decoder) 806, a positive write voltage generating circuit (for Y-decoder) 807, and a control circuit 808.

The flash memory 800 further includes switching circuits 100A, 100B, 100C, 100D, and 100E.

The cell array 801 is a storage section in which memory elements of the flash memory 800 are arrayed in a matrix form (array form).

The X-decoder 802 is a decoder for selecting a word line to select a row in the cell array 801.

The Y-decoder 803 is a decoder for selecting a bit line to select a column in the cell array 801.

The external voltage applying terminal 804 is a terminal for applying a voltage from a power source outside of the flash memory 800. The external voltage applying terminal 804 is connected with the Y-decoder 803 via wires 811-812. The switching circuits 100A-100B are inserted on the wires 811-812, respectively.

The positive read voltage generating circuit 805 is connected with the X-decoder 802 via a wire 813. The switching circuit 100D is inserted on the wire 813. The positive read voltage generating circuit 805 outputs a signal (VOL_WL_READ) for selecting a word line for a read operation if a read (READ) signal is input from the control circuit 808.

The positive write voltage generating circuit 806 is connected with the wire 811 at a point between the switching circuit 100A and the Y-decoder 803 via a wire 814. Also, a wire 815, which is connected with the positive write voltage generating circuit 806, has branches, a wire 815A and a wire 815B.

The wire 815A is connected with the wire 811 at a point between the switching circuit 100A and the Y-decoder 803. The wire 815B is connected with the X-decoder 802. The wire 815A is inserted with the switching circuit 100C. The wire 815B is inserted with the switching circuit 100E.

The positive write voltage generating circuit 806 outputs a signal having a predetermined voltage value to the wire 814 and a signal (VOL_WL_WRITE) for selecting a word line for a write operation to the wire 815 if a write (PGM) signal is input from the control circuit 808.

The signal having the predetermined voltage value is used for complementing the voltage input from the external voltage applying terminal 804, superposed with the voltage input from the external voltage applying terminal 804, and input into the Y-decoder 803 as a signal (VOL_COLDECODE_WRITE).

The positive write voltage generating circuit 807 is connected with the wire 812 at a point between the switching circuit 100B the Y-decoder 803 via the wire 816.

The positive write voltage generating circuit 807 outputs a signal having a predetermined voltage value to the wire 816 if the external application signal, the read (READ) signal, and the write (PGM) signal are input from the control circuit 808.

The signal having the predetermined voltage value is used for complementing the voltage input from the external voltage applying terminal 804, superposed with the voltage input from the external voltage applying terminal 804, and input into the Y-decoder 803 as a signal (VOL_BL_WRITE).

The control circuit 808 is a circuit for controlling an operation (write (PGM (ProGraM)), read (READ, externally applied)) of the flash memory 800 based on a written command. For example, a sequencer may be used for the control circuit 808. Also, the switching circuits 100A-100E include the transistors SW1-SW2 connected between the node A and the node B similarly to the conventional switching circuit 1 (see FIG. 1), on which drive control is executed by the control signal A.

Here, the node A an example of a first node, and the node B an example of a second node. Also, the control signal A is an example of a first control signal.

The circuit configuration of the switching circuits 100A-100E will be described later. Here, a relationship of connections between the node A and node B in the flash memory 800, and a signal input for executing drive control will be described.

As for the switching circuit 100A, a terminal on the left side in FIG. 4 connected with the external voltage applying terminal 804 is the node A, and a terminal on the right side in FIG. 4 connected with the Y-decoder 803 is the node B. Also, drive control is executed for the switching circuit 100A by the external application signal input from the control circuit 808.

As for the switching circuit 100B, a terminal on the left side in FIG. 4 connected with the external voltage applying terminal 804 is the node A, and a terminal on the right side in FIG. 4 connected with the Y-decoder 803 is the node B. Also, drive control is executed for the switching circuit 100B by the external application signal input from the control circuit 808.

As for the switching circuit 100C, a terminal on the upper side in FIG. 4 connected with the switching circuit 100A is the node A, and a terminal on the lower side in FIG. 4 connected with the positive write voltage generating circuit 806 is the node B. Also, drive control is executed for the switching circuit 100C by the external application signal input from the control circuit 808.

As for the switching circuit 100D, a terminal on the upper side in FIG. 4 connected with the positive read voltage generating circuit 805 is the node A, and a terminal on the lower side in FIG. 4 connected with the X-decoder 802 is the node B. Also, drive control is executed for the switching circuit 100D by the external application signal input from the control circuit 808.

As for the switching circuit 100E, a terminal on the upper side in FIG. 4 connected with the positive write voltage generating circuit 806 is the node A, and a terminal on the lower side in FIG. 4 connected with the X-decoder 802 is the node B. Also, drive control is executed for the switching circuit 100E by the external application signal input from the control circuit 808.

The flash memory 800 that includes the switching circuits 100A-100E configured as above executes drive control for the switching circuits 100A-100E, and accesses the cell array 801 for reading or writing data according to the first embodiment.

The flash memory 800 is an example of a semiconductor memory device, which is implemented as an LSI (Large Scale Integrated circuit) with semiconductor manufacturing technology.

Next, the configuration of the switching circuits 100A-100E will be described using FIG. 5 according to the first embodiment. The switching circuits 100A-100E have the same configuration. Therefore, in the following, the switching circuits 100A-100E are simply referred to as the switching circuit 100 if no distinction is required.

Also, in the following description, the same numerical codes are assigned to substantially the same elements as in the conventional switching circuit 1 (see FIG. 1), and their description is omitted.

Figure 5:
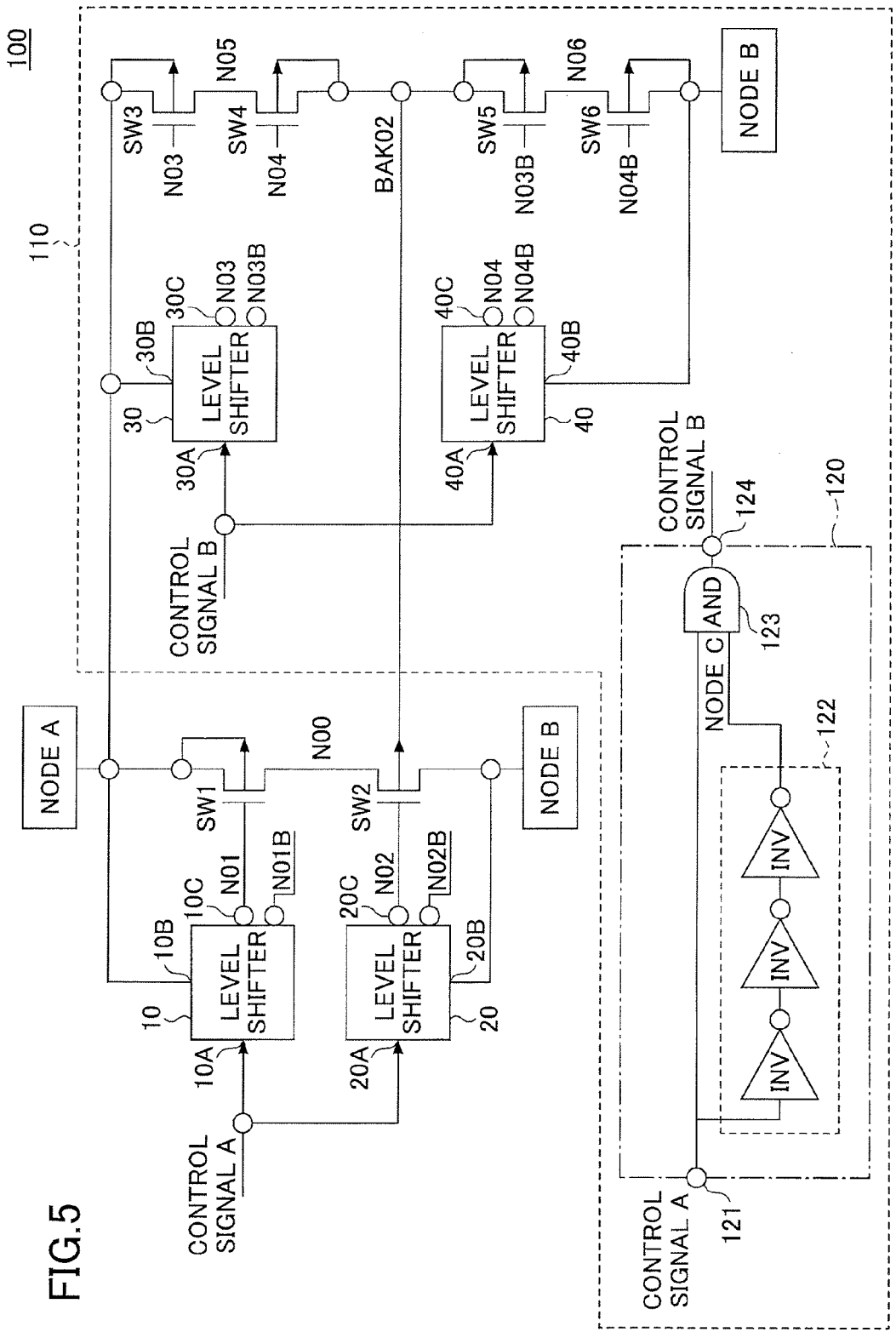
FIG. 5 is a schematic view illustrating the switching circuit 100 according to the first embodiment.

FIG. 5 is a schematic view illustrating the switching circuit 100 according to the first embodiment.

The switching circuit 100 includes a potential control circuit 110 in addition to transistors SW1-SW2 and level shifters 10-20. The transistors SW1-SW2 are an example of a first transistor and a second transistor, respectively. Also, the level shifters 10-20 are examples of a first voltage conversion circuit and a second voltage conversion circuit, respectively.

The potential control circuit 110 includes transistors SW3, SW4, SW5, and SW6, level shifters 30-40, and a generating circuit 120. The transistors SW3, SW4, SW5, and SW6 are examples of a third, a fourth, a fifth, and a sixth transistor, respectively. Also, the level shifters 30-40 are examples of a third voltage conversion circuit and a fourth voltage conversion circuit, respectively.

In FIG. 5 to make connections easy to see, wires are omitted that connect output terminals 30C-40C of the level shifters 30-40 with the gates of the transistors SW3, SW4, SW5, and SW6, and connections are illustrated with denoting nodes by N03, N03B, N04, N04B, N05, N05B, N06, and N06B.

The transistors SW3, SW4, SW5, and SW6 are connected between the node A and the node B in this order.

The transistors SW3, SW4, SW5, and SW6 are all p-type MOSFETs as are the transistors SW1-SW2, and used as switching elements.

The source of the transistor SW3 is connected with the node A, the drain is connected with the source of the transistor SW4, and the gate is connected with the output terminal 30C of the level shifter 30. Here, a potential point that connects the gate of the transistor SW3 and the output terminal 30C of the level shifter 30 is called a "node N03". Here, the source and the well of the transistor SW3 are connected with each other.

The source of the transistor SW4 is connected with the drain of the transistor SW3, the drain is connected with the source of the transistor SW5 and the well of the transistor SW2, and the gate is connected with the output terminal 40C of the level shifter 40.

Here, a potential point that connects the gate of the transistor SW4 and the output terminal 40C of the level shifter 40 is called a "node N04". The drain and the well of the transistor SW4 are connected with each other.

Also, a potential point that connects the drain of the transistor SW3 and the source of the transistor SW4 is called a "node N05".

Also, a potential point that connects the drain of the transistor SW4 with the well of the transistor SW2 and the source of the transistor SW5 is called a "node BAK02".

The source of the transistor SW5 is connected with the drain of the transistor SW4 and the well of the transistor SW2 at the node BAK02, the drain is connected with the source of the transistor SW6, and the gate is connected with the output terminal 30C of the level shifter 30.

Here, a potential point that connects the gate of the transistor SW5 with the output terminal 30C of the level shifter 30 is called a "node N03B". At the node N03B, potential is output that has the reverse phase of the node N03. Namely, potential is generated between the node N03 and N03B due to the differential outputs of the level shifter 30. Here, the source and the well of the transistor SW5 are connected with each other.

Also, a potential point that connects the drain of the transistor SW5 with the source of the transistor SW6 is called a "node N06".

The source of the transistor SW6 is connected with the drain of the transistor SW5, the drain is connected with the node B, the gate is connected with the output terminal 40C of the level shifter 40. Here, a potential point that connects the gate of the transistor SW6 with the output terminal 40C of the level shifter 40 is called a "node N04B". Here, the drain and the well of the transistor SW6 are connected with each other.

The level shifter 30 has the input terminal 30A connected with the output terminal 124 of the generating circuit 120 to receive the control signal B as input. The control signal B is an example of a second control signal. The voltage input terminal 30B of the level shifter 30 is connected with the node A. The pair of output terminals 30C of the level shifter 30 output differential outputs.

One of the pair of output terminals 30C of the level shifter 30 that outputs a positive signal is connected with the gate of the transistor SW3 via the node N03. The other terminal of the pair of output terminals 30C of the level shifter 30 that outputs a negative signal is connected with the gate of the transistor SW5 via the node N03B.

The level shifter 30 is a circuit that sets a voltage value output at the output terminal 30C based on the control signal B. The level shifter 30 outputs a voltage equivalent to the voltage input into the voltage input terminal 30B from the positive terminal of the output terminals 30C to the node N03 if the level of the control signal B is at L (Low) level, or outputs the voltage at ground level (0 V) from the positive terminal of the output terminals 30C to the node N03 if the level of the control signal B is at H (High) level.

Here, the negative terminal of the pair of output terminals 30C outputs a voltage whose phase is inverted to that of the positive terminal to node N03B.

The level shifter 40 has the input terminal 40A connected with the output terminal 124 of the generating circuit 120 to receive the control signal B as input. The voltage input terminal 40B of the level shifter 40 is connected with the node B. The pair of output terminals 40C of the level shifter 40 output differential outputs.

One of the pair of output terminals 40C of the level shifter 40 that outputs a positive signal is connected with the gate of the transistor SW4 via the node N04. The other terminal of the pair of output terminals 40C of the level shifter 40 that outputs a negative signal is connected with the gate of the transistor SW6 via the node N04B.

The level shifter 40 is a circuit that sets a voltage value output at the output terminal 40C based on the control signal B. The level shifter 40 outputs a voltage equivalent to the voltage input into the voltage input terminal 40B from the positive terminal of the output terminals 40C to the node N04 if the level of the control signal B is at L (Low) level, or outputs the voltage at ground level (0 V) from the positive terminal of the output terminals 40C to the node N04 if the level of the control signal B is at H (High) level.

Here, the negative terminal of the pair of output terminals 40C outputs a voltage whose phase is inverted to that of the positive terminal to node N04B.

The generating circuit 120 includes an input terminal 121, a delay element 122, an AND circuit 123, and an output terminal 124. The input terminal 121 of the generating circuit 120 receives the control signal A as input. The generating circuit 120 converts the control signal A input to the input terminal 121 into the control signal B to output it from the output terminal 124.

The input terminal 121 is connected with the input terminals 10A-20A of the level shifters 10-20 outside of the generating circuit 120, and receives the control signal A as input, similarly to the input terminals 10A-20A. Also, the input terminal 121 is connected with the input terminal of the delay element 122 and one of the input terminals of the AND circuit 123 (at the upper side in FIG. 5) in the generating circuit 120.

The input terminal of the delay element 122 is connected with the input terminal 121, and the output terminal is connected with the other input terminal of the AND circuit 123 (at the lower side in FIG. 5). The delay element 122 includes three serially connected inverters between its input terminal and output terminal. The delay element 122 inverts the control signal A input from the input terminal by the three inverters to output it with a delay.

The AND circuit 123 is an example of a logical AND circuit. The AND circuit 123 outputs logical AND of the control signal A input to the input terminal of the generating circuit 120 and the inverted control signal A delayed by the delay element 122. The output terminal of the AND circuit 124 is connected with the output terminal of the generating circuit 120. Here, the other input terminal of AND circuit 123 (at the lower side in FIG. 5) is called a "node C".

The output terminal 124 is connected with the output terminal of the AND circuit 123 in the generating circuit 120 and is connected with the input terminals 30A-40A of the level shifters 30-40 outside of the generating circuit 120.

Here, in the following, there may be cases where the switching circuit 100 is referred to as in an on state if both of the transistors SW1-SW2 are on, and is referred to as in an off state if both of the transistors SW1-SW2 are off.

Next, operation of the generating circuit 120 of the switching circuit 100 and changes of the potential of the node BAK02 will be described according to the first embodiment using FIG. 6.

Figure 6:
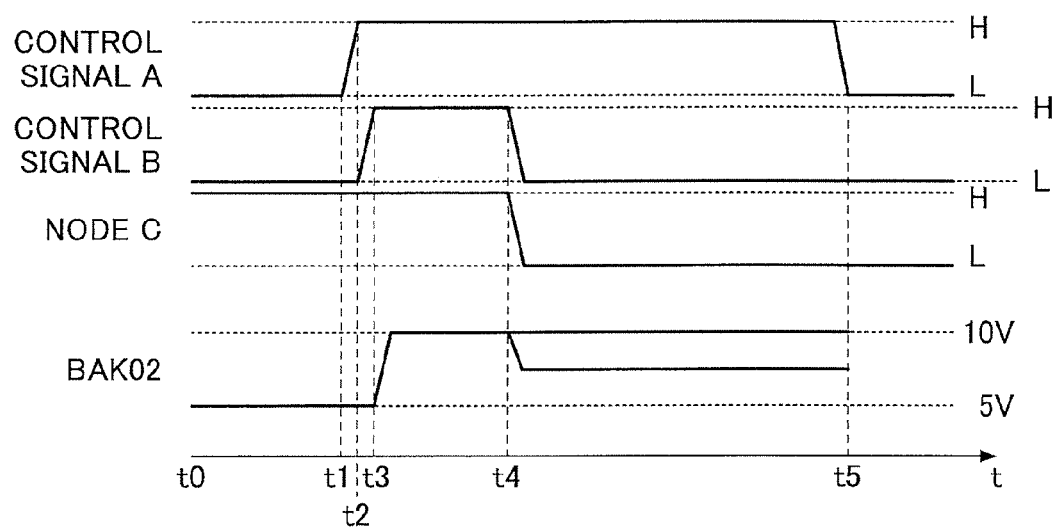
FIG. 6 is a schematic view illustrating operation of a generating circuit 120 in the switching circuit 100 and changes of potential of a node BAK02 according to the first embodiment.

FIG. 6 is a schematic view illustrating operation of a generating circuit 120 in the switching circuit 100 and changes of the potential of a node BAK02 according to the first embodiment. FIG. 6 illustrates temporal changes of the potential of the control signals A-B, the node C, and the node BAK02.

The initial state (time t0) illustrated in FIG. 6 is an initial state when the transistors SW1-SW2 are turned on. Turning on the transistors SW1-SW2 corresponds to, for example, executing a write (PGM) operation in a READ state in the flash memory 800. Therefore, the nodes A and B take the potential of 10 V and 5 V, respectively.

In the initial state (time t0), the control signal A at L level is input into the input terminal 121 of the generating circuit 120 (see FIG. 5). Therefore, the potential of the node C at the output of the delay element 122 is at H level, and the control signal B output from the AND circuit 123 is at L level.

Also, as the control signal A is at L level, the positive outputs of the level shifters 10-20 are at H level, and as both of the nodes N01-N02 become H level, the transistors SW1-SW2 are off.

Also, as the control signal B is at L level, the positive outputs of the level shifters 30-40 are at H level, and as both of the nodes N03-N04 become H level, the transistors SW3-SW4 are off. Also, the negative outputs of the level shifters 30-40 are at L level, and as both of the nodes N03B-N04B become L level, the transistors SW5-SW6 are on.

Therefore, in the initial state (time t0) the node BAK02 is connected with the node B, the node B is at 5 V.

The control signal A starts rising from L level at time t1 and changes to H level at time t2, then one of the input terminals of the AND circuit 123 (at the upper side in FIG. 5) becomes H level, the control signal B starts rising from L level at time t2, and changes to H level at time t3.

Also, as the control signal B changes to H level, the outputs of the level shifters 30-40 changes so that the nodes N03-N04 become L level and the nodes N03B-N04B become H level. This makes the transistors SW3-SW4 turn on and the transistors SW5-SW6 turn off.

As a result, as the node BAK02 is connected with the node A via the turned-on transistors SW3-SW4, the potential of the node BAK02 rises from 5 V to 10 V at time t3.

The potential of the node C does not change at time t1, t2, and t3 because the control signal A input into the delay element 122 is delayed.

The potential of the node C changes to L level at time t4. Time t4 is a time after time t1 by the delay time of the delay element 122. The change of the potential of the node C at time t4 appears as a fall at time t4 as the rise of the control signal A at time t1 is delayed and inverted.

As the potential of the node C changes to L level at time t4, the other input terminal of AND circuit 123 (at the lower side in FIG. 5) receives the input signal at L level, and the control signal B changes to L level at time t4.

When the control signal B changes to L level, the outputs of the level shifters 30-40 change so that the potential of the nodes N03-N04 becomes H level, and the potential of the nodes N03B-N04B becomes L level.

As a result, the transistors SW3-SW4 turn off, and the transistors SW5-SW6 turn on. Namely, the node BAK02 is connected with the node B via the turned-on transistors SW5-SW6. After that, the potential of the node BAK02 becomes equivalent to that of the node B, which has risen from the potential earlier than time t1, and finally reaches 10 V that is equivalent to the potential of the node A after time t4. Here, there are cases where the voltage at the node B after time t4 does not reach 10 V, but for example, about 9 V at which it is balanced with the node A. In this case, the potential of the node BAK02 becomes about 9 V.

Finally, the control signal A changes to L level at time t5.

In this way, if the control signal B changes from L level to H level at time t1, the connection of the node BAK02 is switched from the node B to the node A. As a result, the potential of the node BAK02 at time t1 rises from the potential of the node B (5 V) to the potential of the node A (10 V).

As illustrated in FIG. 6, the control signal B includes a H-level pulse that corresponds to a part of a predetermined duration of the control signal A in the initial state.

Next, operation of the switching circuit 100 will be described according to the first embodiment using FIGS. 7-8.

FIGS. 7A-7B and 8A-8B are schematic views illustrating operation of the switching circuit 100 according to the first embodiment.

Figure 7A:
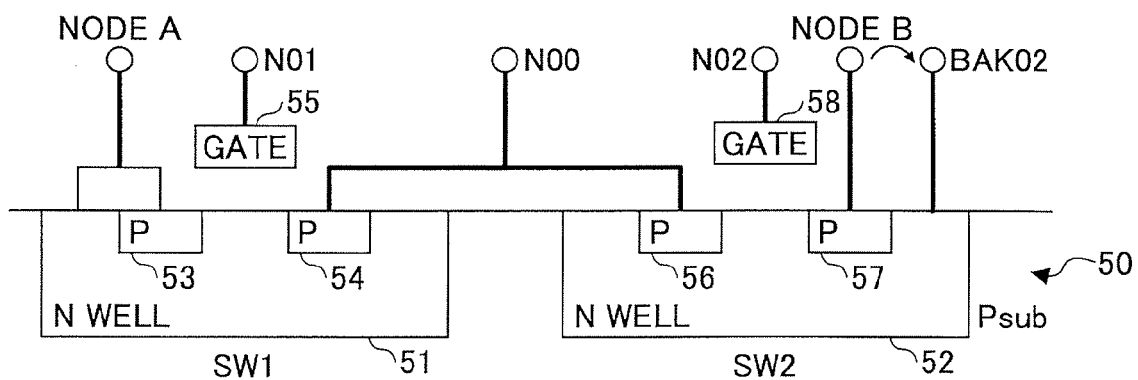
Figure 8A:
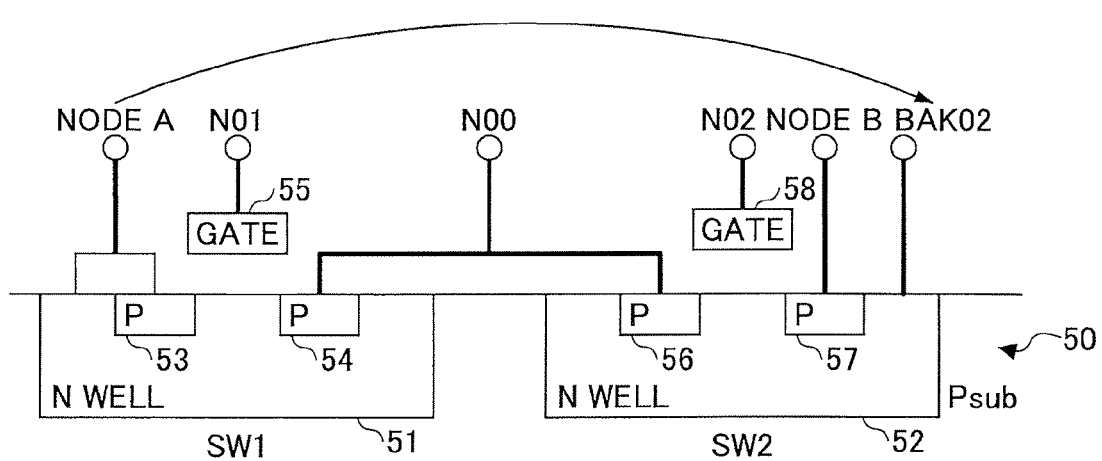

FIGS. 7A-7B illustrate operation of the switching circuit 100 when it is off, and FIGS. 8A-8B illustrate operation of the switching circuit 100 when it is on. Also, FIG. 7A and FIG. 8A illustrate cross-sectional views of the transistors SW1-SW2 of the switching circuit 100, and FIG. 7B and FIG. 8B illustrate timing charts that represent operation of the switching circuit 100, respectively.

First, as illustrated in FIG. 7A, the structure of the transistors SW1-SW2 in the switching circuit 100 is similar to that of the transistors SW1-SW2 in the conventional switching circuit 1 illustrated in FIG. 2A except that the N well 52 of the transistor SW2 is connected with the node BAK02, and the node B is connected only with the drain 57 of the transistor SW2.

Also, FIG. 7B illustrates the potential of the node A, N01, N01B, N00, N05, N02, N02B, N06, BAK02, and the node B.

As illustrated in FIG. 7B, if control signal A is at L level (0 V), the control signal B is at L level.

Also, if the control signal A is at L level (0 V), the outputs of the positive terminals of the level shifters 10-20 (see FIG. 5) become H level, which turn the transistors SW1-SW2 off.

Therefore, if the potential of the node A changes to take 0 V, 5 V, and 10 V as illustrated in FIG. 7B, the voltage of the gate 55 changes similarly, and the potential of the node N01 also changes to take 0 V, 5 V, and 10 V.

Here, the potential of the node N01B remains unchanged at 0 V because the node N01B is not used.

Also, at this moment, for example, the node B remains unchanged at 5 V and so do the voltage of the gate 55 and the potential of the node N02. Here, the potential of the node B may change arbitrarily, which is followed by the potential of the node N02.

Here, the potential of the node N02B remains unchanged at 0 V because the node N02B is not used.

As a result, the potential of the node N00 becomes undefined (Hi-Z). This is because the transistors SW1-SW2 are held in an off-state regardless of the values of the nodes A and B.

Also, if control signal A is held at L level, the control signal B is at L level, the outputs of the positive terminals of the output terminals 30C-40C of the level shifters 30-40 become H level.

Therefore, the potential of the nodes N03-N04 becomes H level, which makes the transistors SW3-SW4 turn off. Therefore, the node N05 becomes Hi-Z.

Also, at this moment, as the outputs of the negative terminals of the output terminals 30C-40C of the level shifters 30-40 become L level, the potential of the nodes N03B-N04B becomes L level, which makes the transistors SW5-SW6 turn on.

Therefore, the potential of the node N06 becomes 5 V because the node N06 is connected with the node B. Also, the potential of the node BAK02 becomes 5 V because the node BAK02 is connected with the node B via the transistors SW5-SW6. An arrow in FIG. 7A indicates that the voltage is supplied from the node B to the node BAK02.

As above, if the switching circuit 100 is off, the nodes N00 and N05 become Hi-Z, and the potential of the nodes N06 and BAK02 becomes 5 V.

Here, although the case is described in which the potential of the nodes N06 and BAK02 becomes 5 V when having the node B fixed at 5 V, the potential of the nodes N06 and BAK02 becomes 0 V or 10 V if the potential of the node B is fixed at 0 V or 10 V.

Next, a case will be described where the transistors SW1-SW2 are turned on. Turning on the transistors SW1-SW2 corresponds to executing a write (PGM) operation in a READ state in the flash memory 800. Therefore, as illustrated in FIG. 8B, the nodes A and B are at the potential of 10 V and 5 V, respectively.

Also, times t0, t1, t2 and t3 are illustrated in FIG. 8B that are the same as in FIG. 6. The time axis (horizontal axis) in FIG. 8B is enlarged greater than the time axis (horizontal axis) in FIG. 6. Therefore, times t4 and t5 after time t3, which are illustrated in FIG. 6, are not illustrated in FIG. 8.

As illustrated in FIG. 8B, in the initial state (at time t0), the control signal A is at L level, hence the switches SW1-SW2 are off, and the node N00 is in a Hi-Z state.

Also, as the control signal B is at L level, the positive outputs of the level shifters 30-40 are at H level, and both of the nodes N03-N03 are at H level. Therefore, the transistors SW3-SW4 are off.

Also, as the potential of the nodes N03-N04 is at H level, the transistors SW5-SW6 are on.

Therefore, the node BAK02 is connected with the node B via the transistors SW5-SW6, and the potential of the node BAK02 is at 5 V.

When the control signal A is switched to H level at time t1, the potential of the nodes N01-N02 becomes 0 V because the output voltage of the level shifters 10-20 becomes L level. At this moment, the node N01 falls down from 10 V to 0 V, the node N02 falls down from 5 V to 0 V. This makes the transistors SW1-SW2 turn on.

At this moment, as a main path (path between the source and drain) of the transistors SW1-SW2 between the node A and the node B is in a conducting state, voltage is supplied from the node A to the node B, and the potential of the node B rises from 5 V to 10 V.

Here, the nodes N01B-N02B take the potential of 10 V and 5 V, respectively.

Also, as described with FIG. 6, the control signal B starts rising from the L level at time t2, and switched to H level at time t3.

This makes the outputs from the output terminals 30C-40C of the level shifters 30-40 change so that the nodes N03-N04 become L level and the transistors SW3-SW4 turn on.

Also, at this moment, as the potential of the nodes N03B-N04B becomes H level, the transistors SW5-SW6 turn off.

As a result, the connection of the node BAK02 is changed from the node B to the node at time t3, hence the potential of the node BAK02 rises to 10 V. An arrow in FIG. 8A indicates that the voltage is supplied from the node A to the node BAK02.

Here, although a switching operation that occurs later is not illustrated in FIG. 8B in that the connection of the node BAK02 is switched back to the node B again, the node BAK02 is connected with the node B at time t4 as illustrated in FIG. 6.

Here, comparing the node BAK02 with the node B, the node B is loaded with comparatively greater parasitic capacitance caused by the drain 57, the N well 52, the p-type substrate 50 and the like, whereas the node BAK02 is loaded only with the transistor SW2 and separated from such parasitic capacitance. Therefore, the node BAK02 has a load less than that of the node B.

Therefore, as illustrated in FIG. 8B, if the potential of the nodes N01-N02 becomes 0 V, which turns on both of the transistors SW1-SW2, the potential of the node BAK02 rises faster than the potential of the node B.

Therefore, at time t3, the potential of the node BAK02 rises at substantially the same timing as the potential of the node N00, and rises to 10 V at substantially the same time.

Therefore, if the node B is in a state where its potential is lower than that of the node A and the switching circuit 100 is turned on by driving the control signal A to H level, the potential of the N well 52 can be made equivalent to the potential of the source 56 in the transistor SW2, which takes the lower potential among transistors SW1-SW2.

This makes it possible to suppress that a forward bias is applied between the source 56 (p region) and the N well 52 when the switching circuit 100 turns on, which suppresses generation of a latchup.

Therefore, an unforeseen situation can be prevented from happening in that the switching circuit 1 becomes uncontrollable due to a latchup.

Namely, compared with the conventional switching circuit 1 (see FIG. 1), the switching circuit 100 can improve operational reliability considerably by suppressing a latchup according to the first embodiment.

Here, the reason why the node BAK02 connected with the N well 52 of the transistor SW2 is connected with the node A for turning on the transistors SW1-SW2 as described above is to suppress generation of a latchup at the lower-potential transistor SW2 when the transistors SW1-SW2 turn on.

Namely, the reason why a period of H level is provided for the control signal B as illustrated in between time t2 and time t4 in FIG. 6 is to suppress generation of a latchup at the lower-potential transistor SW2 when the transistors SW1-SW2 turn on.

Therefore, when turning the transistors SW1-SW2 on, the end of the H-level period of the control signal B (time t4) is set earlier than when the control signal A goes back to L level at time t5.

Also, it has been described above that a latchup is suppressed by connecting the node BAK02 connected with the N well 52 of the transistor SW2 with the node A for turning on the transistors SW1-SW2.

As described above, a forward bias is prevented from generating between the source 56 and the N well 52 by making the potential of the node BAK02 (N well 52) equivalent to the potential of the source 56 of the transistor SW2.

It may be sufficient to execute suppression of such a forward bias until the potential of the node B becomes equivalent to the potential of the node BAK02, and after that, the node BAK02 does not need to be connected with the node A.

Therefore, the node BAK02 connected with the N well 52 of the transistor SW2 needs to be connected with the node A for turning on the transistors SW1-SW2 only for a period after the rise of the control signal A rises until the potential of the node B becomes equivalent to the potential of the node BAK02.

Therefore, the connection of the node BAK02 is switched back to the node B again at time t4 (see FIG. 6).

By switching the connection of the node BAK02 back to the node B again after a risk of forward bias generation disappears as above, the load of the N well 52 of the transistor SW2 can be reduced, and the load of the transistor SW2 can be reduced.

Here, if the load of the transistor SW2 does not matter, the connection of the node BAK02 does not need to be switched back to the node B at time t4 (see FIG. 6), but the node BAK02 may be kept connected with the node A until a write operation of the flash memory 800 ends.

Also, the switching circuit 100 according to the first embodiment can suppress generation of a latchup without disposing a guard ring around the transistor SW2, and without providing a power source circuit such as a charge pump or the like for complementing the current flowing between the source 56 of the transistor SW2 and the N well 52.

Therefore, the switching circuit 100 according to the first embodiment can be made smaller because generation of a latchup can be suppressed effectively without increasing the area of an LSI.

As the switching circuit 100 is implemented as an LSI without increasing the LSI area, not only it can be made smaller, but also cost increase can also be suppressed because less semiconductor materials are used.

It has been described above that a latchup is suppressed by connecting the node BAK02 connected with the N well 52 of the transistor SW2 with the node A for turning on the transistors SW1-SW2.

As described above, a forward bias is prevented from generating between the source 56 and the N well 52 by making the potential of the node BAK02 (N well 52) equivalent to the potential of the source 56 of the transistor SW2.

However, a forward bias may be allowed as long as it does not turn on a parasitic bipolar transistor constituted with a PNP junction of the source 56, the N well 52, and the p-type substrate 50. In this case, the rise of the potential of the node BAK02 may come behind the rise of the potential of the node N00.

Also, conversely, the rise of the potential of the node BAK02 may occur earlier than the rise of the potential of the node N00.

Also in the description above, the connection of the node BAK02 is switched back to the node B again after a risk of forward bias generation disappears. Namely, it has been described that the connection of the node BAK02 is switched back to the node B when the potential of the node B becomes equivalent to the potential of the node BAK02.

However, a forward bias may be allowed as long as it does not turn on a parasitic bipolar transistor constituted with a PNP junction of the source 56, the N well 52, and the p-type substrate 50. In this case, the connection of the node BAK02 may be switched back to the node B before the potential of the node B becomes equivalent to the potential of the node BAK02.

Also in the description above, the level shifters 10-40 are used. However, other circuits may be used instead of the level shifters 10-40 that can convert voltage similarly to the level shifters 10-40 and execute substantially the same operation.

Also in the description above, the switching circuit 100 is used for a flash memory 800. However, the switching circuit 100 can be used for a memory other than the flash memory 800. For example, it can be used for a non-volatile memory other than the flash memory 800.

Also in the description above, the generating circuit 120 of the potential control circuit 110 of the switching circuit 100 includes the delay element 122 in which three inverters are serially connected as illustrated in FIG. 5. However, the configuration of the generating circuit 120 is not limited to such a circuit configuration. For example, instead of the generating circuit 120 illustrated in FIG. 5, a generating circuit 120A illustrated in FIG. 9 may be used.

Figure 9:
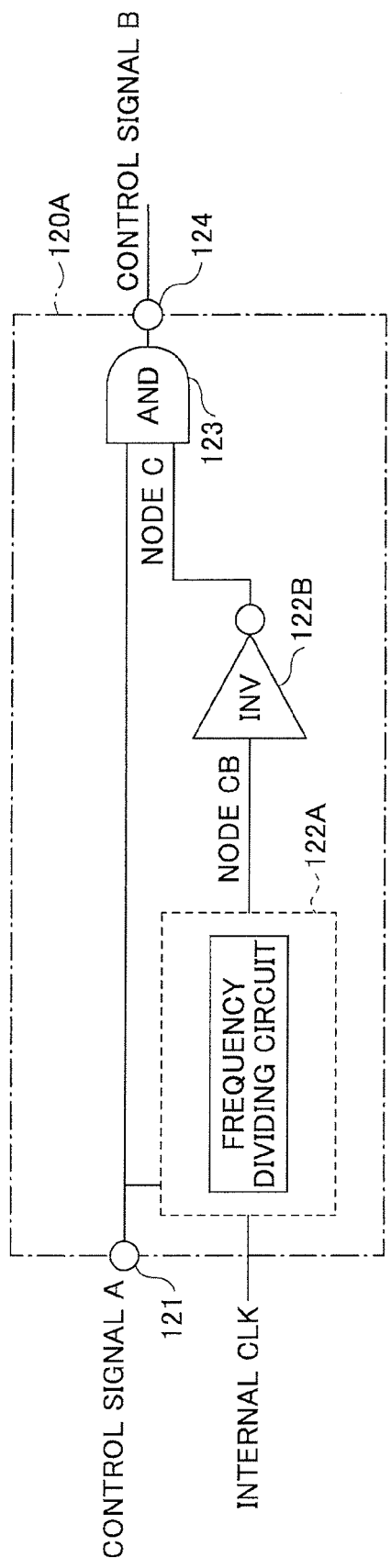
FIG. 9 is a schematic view illustrating a generating circuit 120A according to a modified example of the first embodiment.

FIG. 9 is a schematic view illustrating a generating circuit 120A according to a modified example of the first embodiment.

The generating circuit 120A uses a counter-type delay circuit 122A that includes a frequency dividing circuit, and an inverter 122B, instead of the delay element 122 of the generating circuit 120 illustrated in FIG. 5.

The delay circuit 122A receives the control signal A and the internal clock CLK as input, generates a clock having a frequency of an integer-multiple of the internal clock by applying frequency division to the internal clock CLK, and outputs a clock to the node CB that has the rise delayed relative to the internal clock CLK.

For example, if a clock is generated by the frequency dividing circuit that has a quadruple frequency of that of the internal clock CLK, the rise at the output can be delayed by two cycles of the internal clock CLK relative to the rise of the internal clock CLK input to the delay circuit 122A. Delay times may be set to the delay circuit 122A and the inverter 122B, respectively, so that the sum of the delay time of the delay circuit 122A and the delay time of the inverter 122B becomes equivalent to the delay time of the delay element 122 in the switching circuit 100 according to the first embodiment.

The inverter 122B inverts a signal that is output from the delay circuit 122A to the node CB, and feeds the signal into the other input terminal of AND circuit 123 (at the lower side in FIG. 9). The output of the inverter 122B is the same as the output of the delay element 122 illustrated in FIG. 5.

As above, the generating circuit 120A illustrated in FIG. 9 can be used instead of the generating circuit 120 illustrated in FIG. 5.

Second Embodiment

Figure 10:
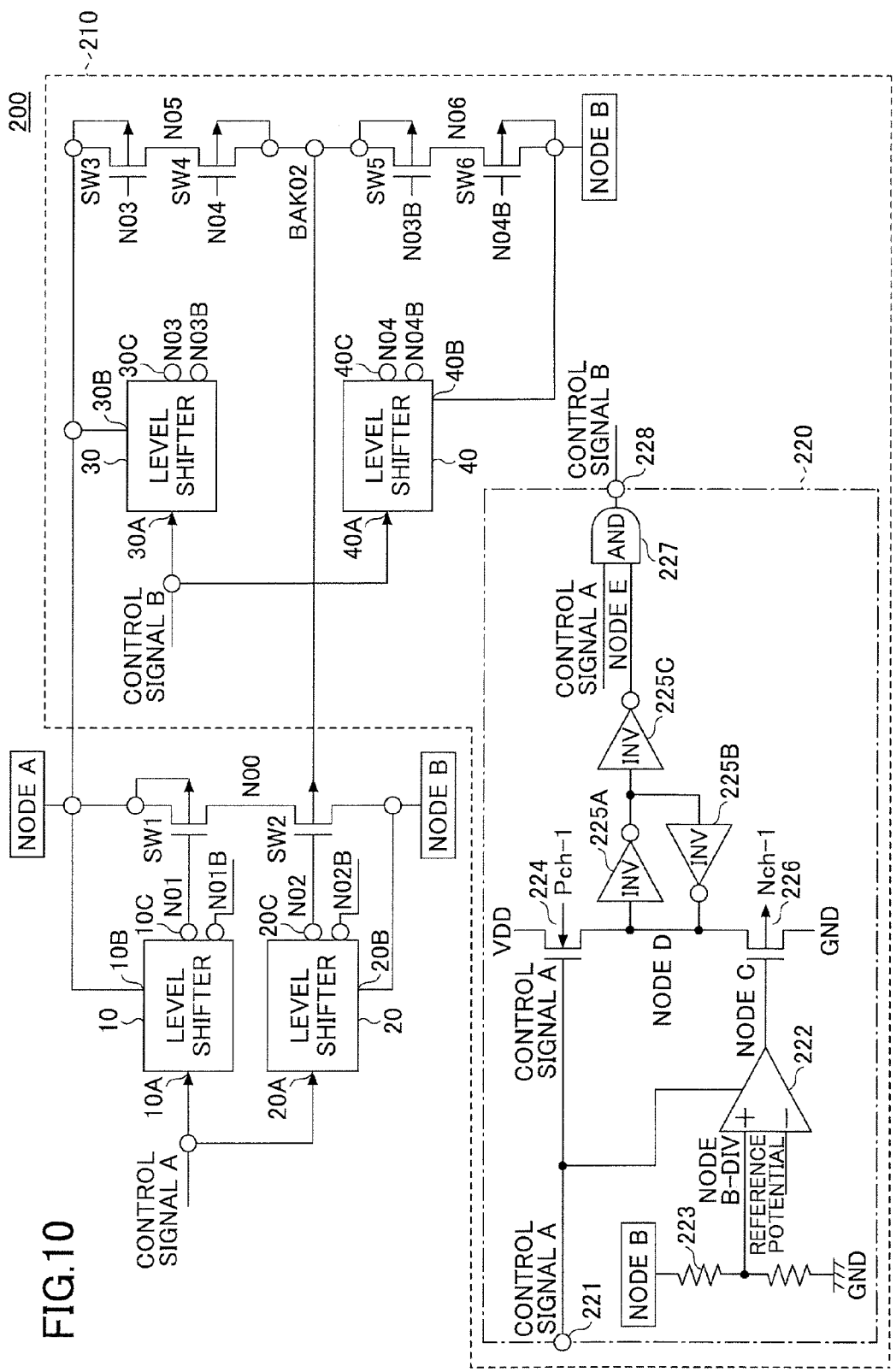
FIG. 10 is a schematic view illustrating a switching circuit 200 according to a second embodiment.

FIG. 10 is a schematic view illustrating a switching circuit 200 according to a second embodiment.

The switching circuit 200 includes a potential control circuit 210 in addition to transistors SW1-SW2 and level shifters 10-20 according to the second embodiment. The potential control circuit 210 includes transistors SW3, SW4, SW5, and SW6, level shifters 30-40, and a generating circuit 220.

Namely, the switching circuit 200 according to the second embodiment has the generating circuit 220 that replaces the generating circuit 120 of the switching circuit 100 (see FIG. 5) according to the first embodiment. As the switching circuit 200 according to the second embodiment has substantially the same configuration as the switching circuit 100 according to the first embodiment except for the generating circuit 220, the same elements are assigned the same numerical codes, and their description is omitted.

The generating circuit 220 includes an input terminal 221, a comparator 222, a voltage dividing circuit 223, a transistor 224, inverters 225A, 225B, and 225C, a transistor 226, an AND circuit 227, and an output terminal 228.

Here, the comparator 222 is an example of a comparing part, the transistor 224 is an example of a first switch, and the transistor 226 an example of a second switch. Also, the inverters 225A-225C are an example of a delay element, and the AND circuit 227 is an example of a logical AND circuit.

The generating circuit 220 is a circuit provided for switching back the connection of the node BAK02 from the node A to the node B if the potential of the node B rises by a certain amount when the transistors SW1-SW2 are turned on to connect the node B with the node A.

The input terminal 221 is a terminal that receives the control signal A as input. The input terminal 221 is connected with the input terminals 10A-20A of the level shifters 10-20 outside of the generating circuit 220, and receives the control signal A as input, similarly to the input terminals 10A-20A. Also, the input terminal 221 is connected with a control terminal of the comparator 222, the gate of the transistor 224, and one of the input terminals of the AND circuit 227 (at the upper side in FIG. 10) in the generating circuit 220.

The comparator 222 has a non-inverted input terminal connected with the output terminal of the voltage dividing circuit 223 (a middle point of a pair of resistors), and an inverted input terminal that receives a reference voltage as input to hold the reference potential. The output terminal of the comparator 222 is connected with the gate of the transistor 226 via the node C.

The voltage dividing circuit 223 includes the pair of resistors. The pair of resistors are serially connected, and their middle point, which is the output terminal of the voltage dividing circuit 223, is connected with the non-inverted input terminal of the comparator 222.

One of the pair of resistors at the higher potential side in the voltage dividing circuit 223 has its terminal opposite to the middle point (the upper terminal in FIG. 10) connected with the node B. Also, the resistor at the lower potential side has its terminal opposite to the middle point (the lower terminal in FIG. 10) grounded to be held at ground (GND) potential. The voltage dividing circuit 223 divides the potential of the node B, and the divided voltage obtained at its output terminal is input into the non-inverted input terminal of the comparator 222. Here, a potential point between the output terminal of the voltage dividing circuit 223 and the non-inverted input terminal of the comparator 222 is called a "node B-DIV".

The transistor 224 is a p-type MOSFET, and has its source connected with the power source VDD, the gate connected with the input terminal 221, and the drain connected with the drain of the transistor 226.

The inverter 225A has its input terminal connected with a point between the drain of the transistor 224 and the drain of the transistor 226. Also, the input terminal of the inverter 225A is connected with the output terminal of the inverter 225B. Namely, the inverters 225A-225B forms a positive feedback connection.

The output terminal of the inverter 225A is connected with the input terminal of the inverter 225B and the input terminal of the inverter 225C.

The inverter 225B has its input terminal connected with the output terminal of the inverter 225A, and its output terminal connected with a point between the drain of the transistor 224 and the drain of the transistor 226, and the input terminal of the inverter 225A.

The inverter 225C has its input terminal connected with the output terminal of the inverter 225A and the input terminal of the inverter 225B, and its output terminal connected with the other input terminal of AND circuit 227 (at the lower side in FIG. 10).

The transistor 226 is a n-type MOSFET, and has its drain connected with the drain of the transistor 224, its gate connected with the output terminal of the comparator 222, and its source grounded.

The AND circuit 227 has one of its input terminals (at the upper side in FIG. 10) connected with the input terminal 221, the other input terminal (at the lower side in FIG. 10) connected with the output terminal of the inverter 225C, and its output terminal connected with the output terminal 228.

The output terminal 228 is connected with the output terminal of the AND circuit 227 in the generating circuit 220, and connected with the input terminals 30A-40A of the level shifters 30-40 outside of the generating circuit 220.

Next, operation of the switching circuit 200 including the generating circuit 220 will be described using FIG. 11.

Figure 11:
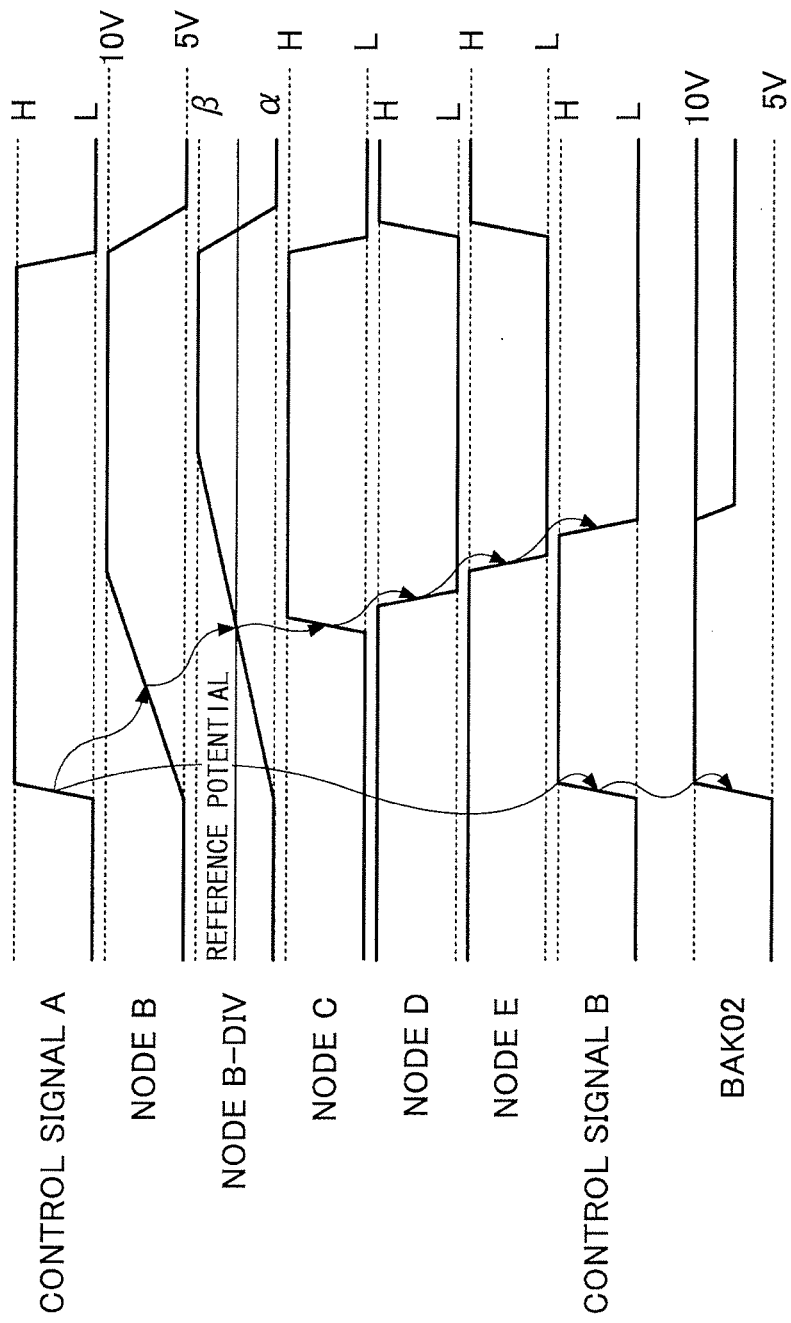
FIG. 11 is a schematic view illustrating operation of the switching circuit 200.

FIG. 11 is a schematic view illustrating operation of the switching circuit 200.

In the initial state where the control signal A is at L level, the transistors SW1-SW2 are off, the potential of the node B is at 5 V, and the potential of the node B-DIV is at α. Here, the potential of the node B-DIV α is a value obtained by dividing the potential of the node B of 5 V by the voltage dividing circuit 230, which is a value lower than the reference potential of the comparator 222.

At this moment, the comparator 222 outputs L level because the potential of the node B-DIV α is lower than the reference potential of the comparator 222. Therefore, the node C becomes L level.

Also, as the node C is at L level, the transistor 226 becomes off. Also, at this moment, as the control signal A is at L level, the transistor 224 is on. Therefore, in the initial state, the node D becomes H level. Also, as the node D is at H level, the node E is at H level.

Also, as the AND circuit 227 receives the control signal A at L level, and the H level signal of the node E as input, the output of the AND circuit 227 in the initial state becomes L level. Therefore, in the initial state, the control signal B is at L level.

Also, when the control signal B is at L level, the transistors SW3-SW4 are off and the transistors SW5-SW6 are on, hence the node BAK02 is connected with the node B. Therefore, in the initial state, the potential of the node BAK02 is at 5V.

The potential of the nodes in the initial state before the control signal A rises is described as above.

Next, operation of the switching circuit 200 will be described when the control signal A rises to H level. In the following, a series of changes at the nodes caused by the rise of the control signal A are designated by arrows illustrated in FIG. 11.

If the control signal A rises to H level, the outputs of the level shifters 10-20 change, the potential of the nodes N01-N02 becomes L level, hence the transistors SW1-SW2 become on. This makes the potential of the node B starts rising from 5 V. The potential of the node B rises up to 10 V.

Also, if the control signal A rises to H level, the transistor 224 becomes off. Also, if the control signal A rises to H level, the control signal B rises as the AND circuit 227 receives the control signal A at H level and the potential of the node E at H level as input.

If the control signal B rises with the rise of the control signal A in this way, the outputs of the level shifters 30-40 change, the transistors SW3-SW4 become on and the transistors SW5-SW6 become off as the potential of the nodes N03-N04 become L level. Therefore, the node BAK02 is connected with the node A, and the potential of the node BAK02 rises to 10 V.

Also, the potential of the node B starts rising and the output of the voltage dividing circuit 223 starts rising, and if the potential of the node B-DIV becomes greater than the reference potential of the comparator 222, the potential of the node C becomes H level, and the transistor 226 becomes on. Here, the potential of the node B-DIV rises up to β. The potential β is potential obtained at the output terminal of the voltage dividing circuit 230 when the potential of the node B becomes 10 V.

The potential of the node D falls down to L level if the transistor 226 turns on with the transistor 224 in an off-state.

Also, this makes the potential of the node E become L level when the delay time due to the inverters 225A and 225C has passed.

Also, if the node E becomes L level, the output of the AND circuit 227 becomes L level as the AND circuit 227 receives the control signal A at H level and the potential of the node E at L level as input. This makes the potential of the node B fall down to L level.

If the control signal B falls down to L level, the outputs of the level shifters 30-40 change, the transistors SW3-SW4 become off and the transistors SW5-SW6 become on as the potential of the nodes N03-N04 become H level. Therefore, the node BAK02 is connected with the node B.

This makes the potential of the node BAK02 become equivalent to that of the node B, which has risen from the potential (5 V), which is taken when the control signal A has not yet started rising, and finally reaches 10 V that is equivalent to the potential of the node A. Here, there are cases where the voltage at the node B does not reach 10 V, but, for example, about 9 V at which it is balanced with the node A. In this case, the potential of the node BAK02 becomes about 9 V.

As described above, the control signal B rises to H level in response to the rise of the control signal A to H level, then falls down to L level while the control signal A stays at H level (after the control signal A has risen and the node B reaches the predetermined potential), similarly to the control signal B according to the first embodiment.

The predetermined time from the rise of the control signal A is set equivalent to the delay time given to the signal by the delay element 122 and the AND circuit 123 included in the generating circuit 120 of the switching circuit 100 according to the first embodiment.

Namely, the time for the control signal A to go through the generating circuit 220 from the input terminal 221 to the output terminal 228 is set equivalent to the delay time given to the signal by the delay element 122 and the AND circuit 123 included in the generating circuit 120 of the switching circuit 100 according to the first embodiment.

When turning the switching circuit 200 on, the rise of the potential of the node B comes behind the rise of the potential of the node N00 for a predetermined period soon after the switching circuit 200 turns on.

To suppress generation of a latchup during this period, a generating circuit 220 is provided.

The generating circuit 220 is a circuit provided based on a notion that a latchup is not generated if the connection of the node BAK02 is switched back from the node A to the node B as long as the potential of the node B rises by a certain amount when the transistors SW1-SW2 are turned on to connect the node B with the node A.

As described above, in the switching circuit 200 according to the second embodiment, similarly to the switching circuit 100 according to the first embodiment, if the node B is in a state where its potential is lower than that of the node A and the switching circuit 200 is turned on by driving the control signal A to H level, the potential of the N well 52 can be made equivalent to the potential of the source 56 in the transistor SW2, which takes the lower potential among transistors SW1-SW2.

This makes it possible to suppress a forward bias that is applied between the source 56 (p region) and the N well 52 when the switching circuit 200 turns on, which suppresses generation of a latchup.

Therefore, an unforeseen situation can be prevented from happening in that the switching circuit 200 becomes uncontrollable due to a latchup.

Namely, compared with the conventional switching circuit 1 (see FIG. 1), the switching circuit 200 can improve operational reliability considerably by suppressing a latchup according to the second embodiment.

Also, the switching circuit 200 according to the second embodiment can suppress generation of a latchup without disposing a guard ring around the transistor SW2, and without providing a power source circuit such as a charge pump or the like for complementing the current flowing between the source 56 of the transistor SW2 and the N well 52.

Therefore, the switching circuit 200 according to the second embodiment can be made smaller because generation of a latchup can be suppressed effectively without increasing the area of an LSI.

As the switching circuit 200 is implemented as an LSI without increasing the LSI area, not only it can be made smaller, but also cost increase can also be suppressed because less semiconductor materials are used.

Here, it has been described above that the inverted input terminal of the comparator 222 of the generating circuit 220 receives the reference voltage as input to hold the reference potential. The reference voltage is generated from the voltage supplied at the outside of the switching circuit 200.

However, the inverted input terminal of the comparator 222 of the generating circuit 220 may receive, for example, another reference voltage as input that is obtained by dividing the potential of the node A. In this case, the reference voltage can be generated in the switching circuit 200.

Third Embodiment

Figure 12:
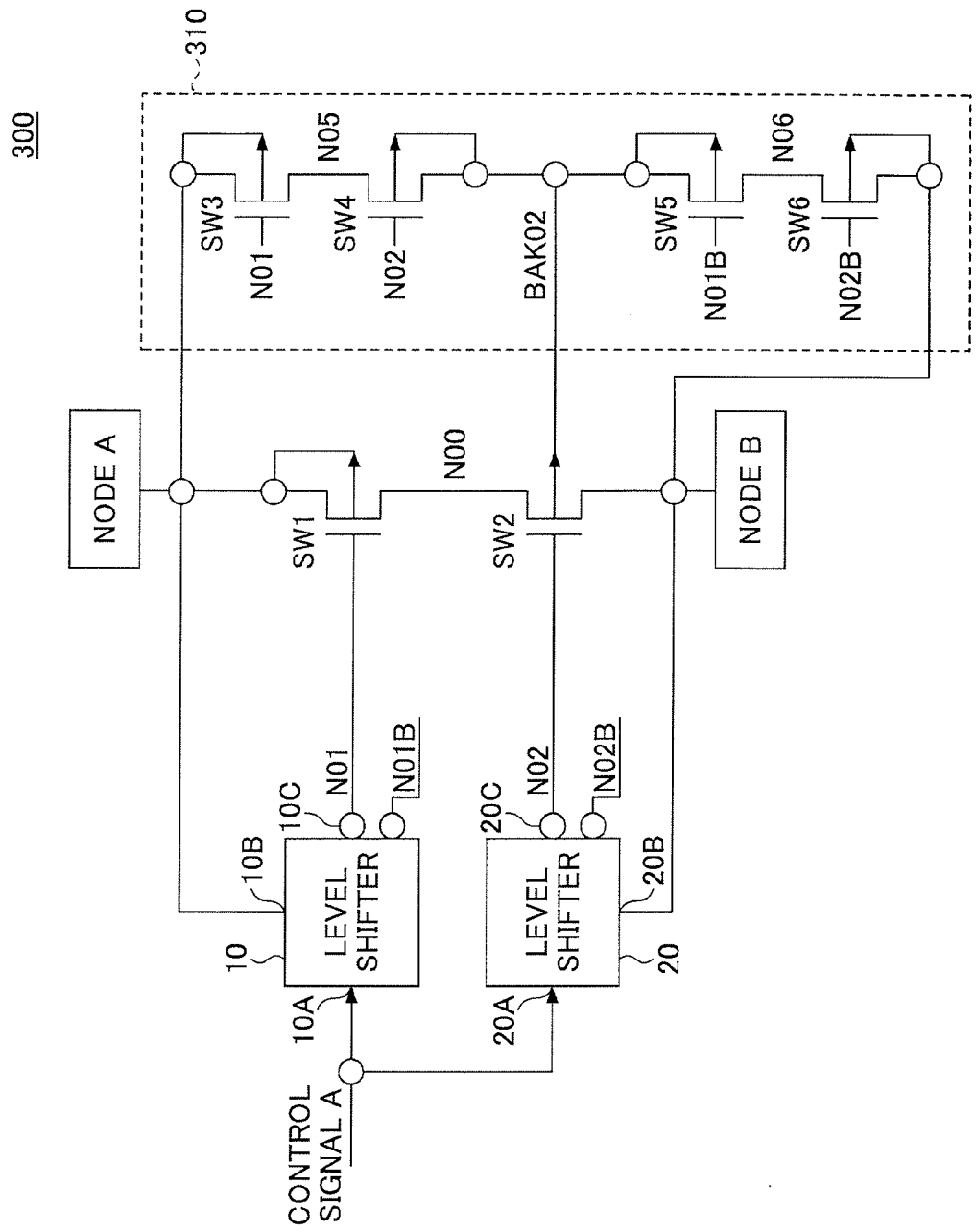
FIG. 12 is a schematic view illustrating a switching circuit 300 according to a third embodiment.

FIG. 12 is a schematic view illustrating a switching circuit 300 according to a third embodiment.

The switching circuit 300 includes a potential control circuit 310 in addition to transistors SW1-SW2 and level shifters 10-20. The switching circuit 300 according to the third embodiment has the potential control circuit 310 that replaces the potential control circuit 110 of the switching circuit 100 according to the first embodiment. As the other elements are substantially the same as in the switching circuit 100 according to the first embodiment, the same elements are assigned the same numerical codes, and their description is omitted.

The potential control circuit 310 includes transistors SW3, SW4, SW5, and SW6.

The transistors SW3, SW4, SW5, and SW6 are connected between the node A and the node B in this order.

The transistors SW3, SW4, SW5, and SW6 are all p-type MOSFETs as are the transistors SW1-SW2, and used as switching elements.

The source of the transistor SW3 is connected with the node A, the drain is connected with the source of the transistor SW4, and the gate is connected with the positive output terminal 100 of the level shifter 10. Namely, the gate of the transistor SW3 is connected with the node N01. Here, the source and the well of the transistor SW3 are connected with each other.

The source of the transistor SW4 is connected with the drain of the transistor SW3, the drain is connected with the source of the transistor SW5 and the well of the transistor SW2, and the gate is connected with the output terminal 20C of the level shifter 20. Namely, the gate of the transistor SW4 is connected with the node N02. Here, the drain and the well of the transistor SW4 are connected with each other.

Also, a potential point that connects the drain of the transistor SW3 with the source of the transistor SW4 is called a "node N05".

Also, a potential point that connects the drain of the transistor SW4 with the well of the transistor SW2 and the source of the transistor SW5 is called a "node BAK02".

The source of the transistor SW5 is connected with the drain of the transistor SW4 and the well of the transistor SW2 at the node BAK02, the drain is connected with the source of the transistor SW6, and the gate is connected with the negative output terminal 10C of the level shifter 10. Here, the source and the well of the transistor SW5 are connected with each other.

Also, a potential point that connects the drain of the transistor SW5 with the source of the transistor SW6 is called a "node N06".

The source of the transistor SW6 is connected with the drain of the transistor SW5, the drain is connected with the node B, the gate is connected with the negative output terminal 20C of the level shifter 20. Namely, the gate of the transistor SW6 is connected with the node N02B. Here, the drain and the well of the transistor SW6 are connected with each other.

In the switching circuit 300 described as above, if the control signal A rises to H level, the outputs of the level shifters 10-20 change, the potential of the nodes N01-N02 becomes L level, hence the nodes N01B-N02B becomes H level.

If the potential of the nodes N01-N02 becomes L level, the transistors SW1-SW2 turn on, the node A and the node B are connected with each other, and the transistors SW3-SW4 become on. Also, if the potential of the nodes N01B-N02B becomes H level, the transistors SW5-SW6 become off.

Therefore, if the control signal A becomes H level, the node BAK02 is connected with the node A.

Namely, if the transistors SW1-SW2 turn on, the potential of the N well 52 of the transistor SW2 having the lower potential (see FIG. 8A) can be set equivalent to the potential of the source 56.

This makes it possible to suppress a forward bias that is applied between the source 56 (p region) and the N well 52 when the switching circuit 300 turns on, which suppresses generation of a latchup.

Also, if the control signal A falls down from H level to L level, the level shifters 10-20 change, the potential of the nodes N01-N02 becomes H level, and the potential of the nodes N01B-N02B becomes L level.

If the potential of the nodes N01-N02 becomes H level, the transistors SW1-SW2 turn off, the node A and the node B are disconnected, and the transistors SW3-SW4 become off. Also, if the potential of the nodes N01B-N02B becomes L level, the transistors SW5-SW6 become on.

Therefore, if the control signal A becomes L level, the node BAK02 is connected with the node B.

This makes it possible to suppress a forward bias that is applied between the source 56 (p region) and the N well 52 when the switching circuit 300 turns on, which suppresses generation of a latchup.

Therefore, an unforeseen situation can be prevented from happening in that the switching circuit 300 becomes uncontrollable due to a latchup.

Namely, compared with the conventional switching circuit 1 (see FIG. 1), the switching circuit 300 can improve operational reliability considerably by suppressing a latchup according to the third embodiment.

Also, the switching circuit 300 according to the third embodiment can suppress generation of a latchup without disposing a guard ring around the transistor SW2, and without providing a power source circuit such as a charge pump or the like for complementing the current flowing between the source 56 of the transistor SW2 and the N well 52.

Therefore, the switching circuit 300 according to the third embodiment can be made smaller because generation of a latchup can be suppressed effectively without increasing the area of an LSI.

As the switching circuit 300 is implemented as an LSI without increasing the LSI area, not only it can be made smaller, but also cost increase can also be suppressed because less semiconductor materials are used.

Fourth Embodiment

Figure 13:
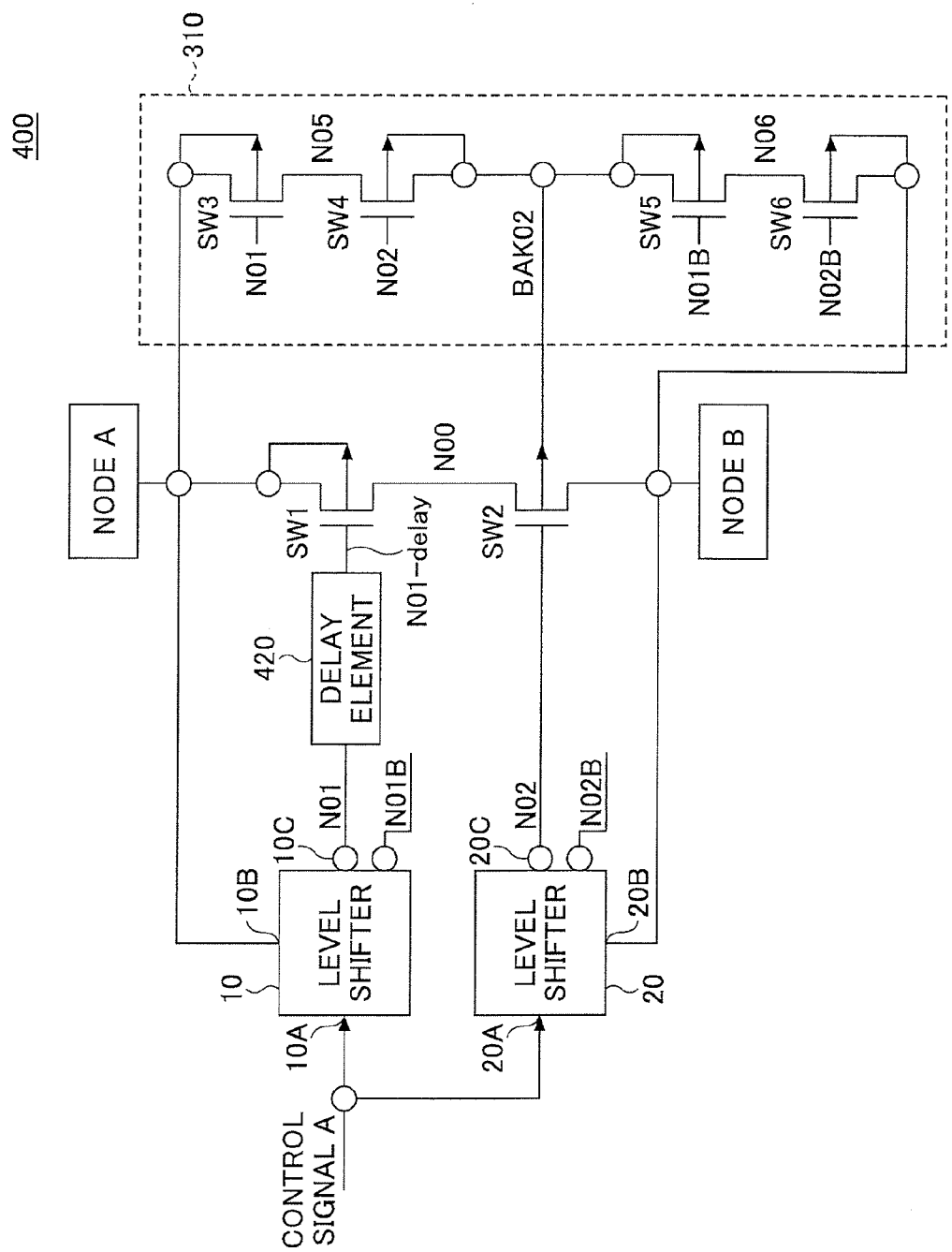
FIG. 13 is a schematic view illustrating a switching circuit 400 according to a fourth embodiment.

FIG. 13 is a schematic view illustrating a switching circuit 400 according to a fourth embodiment.

The switching circuit 400 includes transistors SW1-SW2, level shifters 10-20, a potential control circuit 310, and a delay element 420. The switching circuit 400 according to the fourth embodiment has the delay element 420 inserted between the node N01 and the gate of the transistor SW1 of the switching circuit 300. As the other elements are substantially the same as in the switching circuit 100 according to the first embodiment, the same elements are assigned the same numerical codes, and their description is omitted.

Here, a potential point between the delay element 420 and the gate of the transistor SW1 is called a "node N01-delay".

Figure 14:
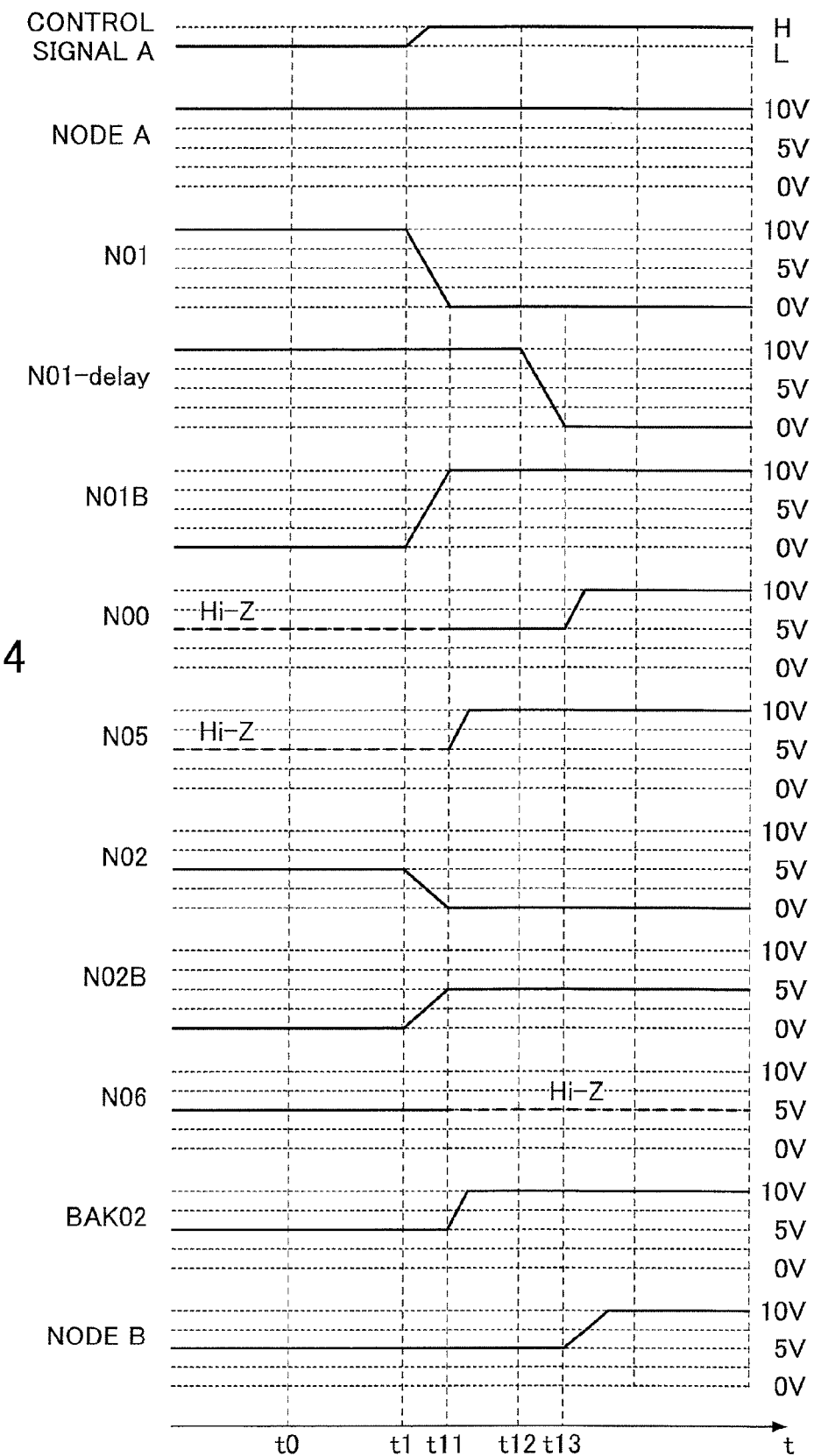
FIG. 14 is a schematic view illustrating operation of the switching circuit 400 according to the fourth embodiment.

FIG. 14 is a schematic view illustrating operation of the switching circuit 400 according to the fourth embodiment.

FIG. 14 illustrates temporal changes of the potential of the control signal A, the nodes A, N01, N01-delay, N01B, N00, N05, N02, N02B, N06, BAK02, and B.

As illustrated in FIG. 14, in the initial state (at time t0), the control signal A is at L level, hence the switches SW1-SW2 are off and the node N00 is in a Hi-Z state.

Also, as the potential of the nodes N01-N02 is at H level (10 V, 5 V), the transistors SW3-SW4 are off. Also, the potential of the nodes N01B-N02B is at L (0 V) level, and the transistors SW5-SW6 are on.

Therefore, the node BAK02 is connected with the node B via the transistors SW5-SW6, and the potential of the node BAK02 is at 5 V.

When the control signal A is switched to H level at time t1, the output voltage of the level shifters 10-20 change, the potential of the nodes N01-N02 becomes 0 V, the potential of the node N01B becomes 10 V, and the potential of the N02B becomes 5V. At this moment, the node N01 falls down from 10 V to 0 V, the node N02 falls down from 5 V to 0 V.

This makes the transistor SW2 turn on and the node N00 connected with the node B, hence the potential of the node N00 changes from Hi-Z to the potential of the node B, or 5 V.

Also, the transistors SW3-SW4 become on and the transistors SW5-SW6 become off. Therefore, the node BAK02 is connected with the node A, and the potential of the node BAK02 rises to 10 V at time t11.

Here, as the transistors SW5-SW6 become off, the node N06 becomes Hi-Z after time t11.

Also, the delay element 420 receives the potential of the node N01 as input, outputs it to the node N01-delay with some delay. The delay time is the period between time t1 and time t12.

As the potential of the node N01-delay starts falling down from 10 V at time t12 and becomes 0 V at time t13, the transistor SW1 becomes on at time t13. This makes the node N00 connect with the node A, hence the potential of the node N00 rises at time t13.

Also, as the transistor SW1 becomes on at time t13, the node B is connected with the node A, and the potential of the node B starts rising to 10 V.

As above, in the switching circuit 400 according to the fourth embodiment, the node BAK02 is connected with the node A at time t11 to rise the potential of the node BAK02, then the transistor SW1 becomes on at time t13.

In other words, before turning the transistor SW1 on at time t13, the node BAK02 is connected with the node A at time t11 to raise the potential of the node BAK02 beforehand.

Therefore, when the node B is in a state where its potential is lower than that of the node A and the switching circuit 400 is turned on by driving the control signal A to H level, the potential of the N well 52 can be made equivalent to the potential of the node A in the transistor SW2, which takes the lower potential among transistors SW1-SW2.

As the potential of the N well 52 has already reached the same potential as the node A when the transistor SW1 turns on at time t13, it is possible to more securely suppress that a forward bias is applied between the source 56 (p region) and the N well 52, which more securely suppress generation of a latchup.

Therefore, an unforeseen situation can be prevent from happening in that the switching circuit 400 becomes uncontrollable due to a latchup.

Namely, compared with the conventional switching circuit 1 (see FIG. 1), the switching circuit 400 can improve operational reliability considerably by suppressing a latchup according to the second embodiment.

Also, the switching circuit 400 according to the second embodiment can suppress generation of a latchup without disposing a guard ring around the transistor SW2, and without providing a power source circuit such as a charge pump or the like for complementing the current flowing between the source 56 of the transistor SW2 and the N well 52.

Therefore, the switching circuit 400 according to the fourth embodiment can be made smaller because generation of a latchup can be suppressed effectively without increasing the area of an LSI.

As the switching circuit 400 is implemented as an LSI without increasing the LSI area, not only it can be made smaller, but also cost increase can also be suppressed because less semiconductor materials are used.

Fifth Embodiment

Figure 15:
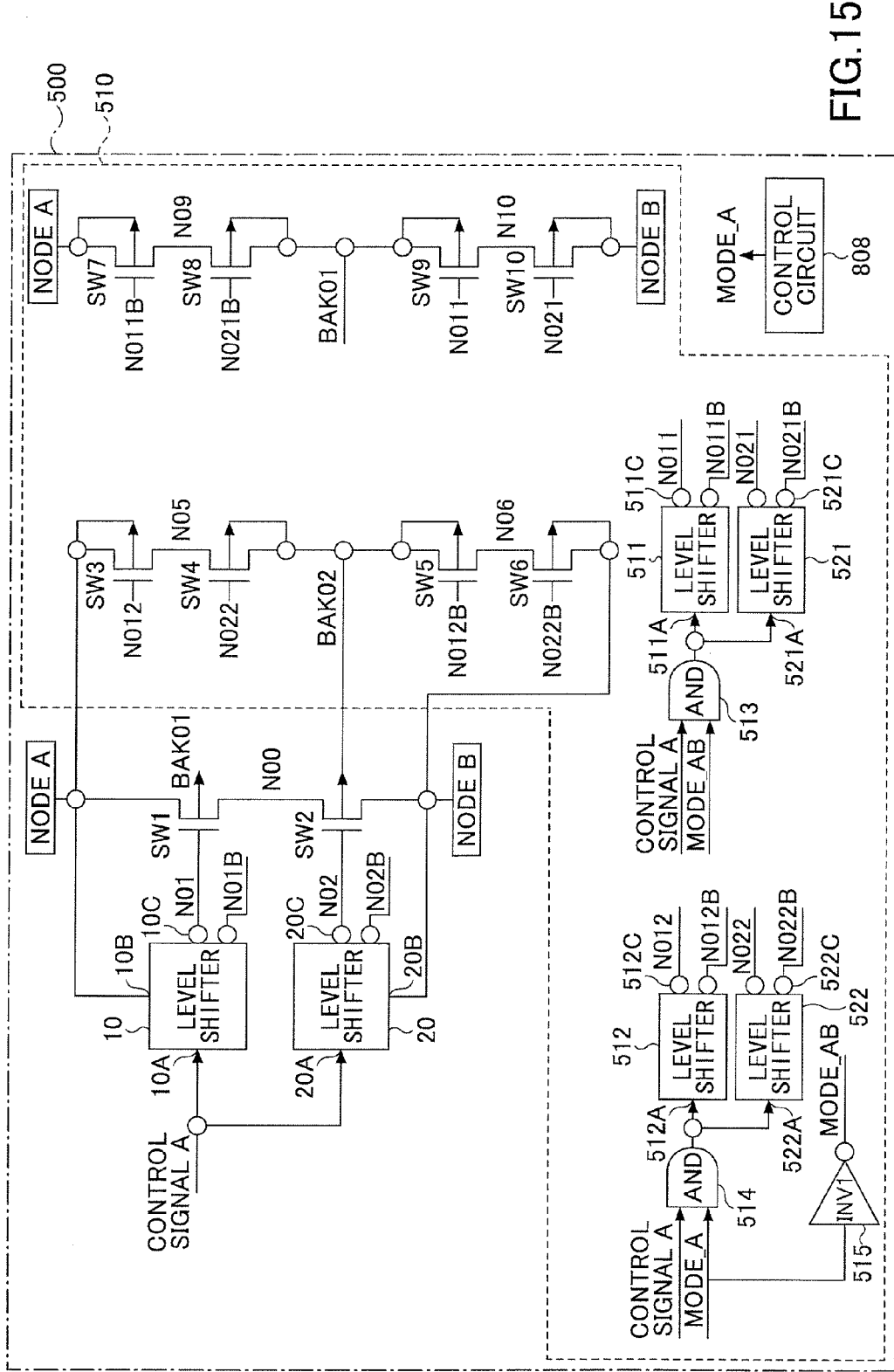
FIG. 15 is a schematic view illustrating a switching circuit 500 according to a fifth embodiment.

FIG. 15 is a schematic view illustrating a switching circuit 500 according to a fifth embodiment.

The switching circuit 500 includes a potential control circuit 510 in addition to transistors SW1-SW2 and level shifters 10-20. The switching circuit 500 according to the fifth embodiment has the potential control circuit 510 that replaces the potential control circuit 310 of the switching circuit 300 according to the third embodiment. Also, with this replacement, the well of the transistor SW1 is connected with the potential control circuit 510.

As the other elements are substantially the same as in the switching circuit 300 according to the third embodiment, the same elements are assigned the same numerical codes, and their description is omitted. Here, FIG. 15 also illustrates the control circuit 808 of the flash memory 800.

The potential control circuit 510 includes transistors SW3, SW4, SW5, SW6, SW7, SW8, SW9, and SW10, level shifters 511, 512, 521, and 522, AND circuits 513-514, and an inverter 515.

The transistors SW3, SW4, SW5, and SW6 are connected between the node A and the node B in this order.

The transistors SW3, SW4, SW5, and SW6 are all p-type MOSFETs as are the transistors SW1-SW2, and used as switching elements.

Similarly, the transistors SW7, SW8, SW9, and SW10 are connected between the node A and the node B in this order.

The transistors SW7, SW8, SW9, and SW10 are all p-type MOSFETs as are the transistors SW1-SW2, and used as switching elements.

The source of the transistor SW3 is connected with the node A, the drain is connected with the source of the transistor SW4, and the gate is connected with the positive output terminal 512C of the level shifter 512. Here, a potential point that connects the gate of the transistor SW3 and the positive output terminal 512C of the level shifter 512 is called a "node N012". Here, the source and the well of the transistor SW3 are connected with each other.

The source of the transistor SW4 is connected with the drain of the transistor SW3, the drain is connected with the source of the transistor SW5 and the well of the transistor SW2, and the gate is connected with the positive output terminal 522C of the level shifter 522.

Here, a potential point that connects the gate of the transistor SW4 and the output terminal 522C of the level shifter 522 is called a "node N022". Here, the drain and the well of the transistor SW4 are connected with each other.

Also, a potential point that connects the drain of the transistor SW3 with the source of the transistor SW4 is called a "node N05".

Also, a potential point that connects the drain of the transistor SW4 with the well of the transistor SW2 and the source of the transistor SW5 is called a "node BAK02".

The source of the transistor SW5 is connected with the drain of the transistor SW4 and the well of the transistor SW2 at the node BAK02, the drain is connected with the source of the transistor SW6, and the gate is connected with the output terminal 512C of the level shifter 512.

Here, a potential point that connects the gate of the transistor SW5 and the negative output terminal 512C of the level shifter 512 is called a "node N012B". At the node N012B, potential is output that has the reverse phase of the node N012. Namely, potential is generated between the nodes N012 and N012B due to the differential outputs of the level shifter 512. Here, the source and the well of the transistor SW5 are connected with each other.

Also, a potential point that connects the drain of the transistor SW5 with the source of the transistor SW6 is called a "node N06".

The source of the transistor SW6 is connected with the drain of the transistor SW5, the drain is connected with the node B, the gate is connected with the negative output terminal 522C of the level shifter 522. Here, a potential point that connects the gate of the transistor SW6 with the negative output terminal 522C of the level shifter 522 is called a "node N022B". At the node N022B, potential is output that has the reverse phase of the node N022. Namely, potential is generated between the node N022 and N022B due to the differential outputs of the level shifter 522. Here, the drain and the well of the transistor SW6 are connected with each other.

The source of the transistor SW7 is connected with the node A, the drain is connected with the source of the transistor SW8, the gate is connected with the positive output terminal 511C of the level shifter 511. Here, a potential point that connects the gate of the transistor SW7 with the negative output terminal 511C of the level shifter 511 is called a "node N011B". Here, the source and the well of the transistor SW7 are connected with each other.

The source of the transistor SW8 is connected with the drain of the transistor SW7, the drain is connected with the source of the transistor SW9 and the well of the transistor SW1, the gate is connected with the positive output terminal 521C of the level shifter 521.

Here, a potential point that connects the gate of the transistor SW8 with the output terminal 521C of the level shifter 521 is called a "node N021B". Here, the drain and the well of the transistor SW8 are connected with each other.

Also, a potential point that connects the drain of the transistor SW7 with the source of the transistor SW8 is called a "node N09".

Also, a potential point that connects the drain of the transistor SW8 with the well of the transistor SW1 and the source of the transistor SW9 is called a "node BAK01".

The source of the transistor SW9 is connected with the drain of the transistor SW8 and the well of the transistor SW1 at the node BAK01, the drain is connected with the source of the transistor SW10, the gate is connected with the negative output terminal 511C of the level shifter 511.

Here, a potential point that connects the gate of the transistor SW9 with the output terminal 511C of the level shifter 511 is called a "node N011". At the node N011B, potential is output that has the reverse phase of the node N011. Namely, potential is generated between the node N011 and N011B due to the differential outputs of the level shifter 511. Here, the source and the well of the transistor SW9 are connected with each other.

Also, a potential point that connects the drain of the transistor SW9 with the source of the transistor SW10 is called a "node N10".

The source of the transistor SW10 is connected with the drain of the transistor SW9, the drain is connected with the node B, the gate is connected with the positive output terminal 521C of the level shifter 521. Here, a potential point that connects the gate of the transistor SW10 with the output terminal 521C of the level shifter 521 is called a "node N021". Here, the drain and the well of the transistor SW10 are connected with each other. At the node N021B, potential is output that has the reverse phase of the node N021. Namely, potential is generated between the node N021 and N021B due to the differential outputs of the level shifter 521.

The AND circuit 513 is connected at input sides of the input terminal 511A of the level shifter 511 and the input terminal 521A of the level shifter 521, respectively. Namely, the output terminal of the AND circuit 513 is connected with the input terminal 511A of the level shifter 511 and the input terminal 521A of the level shifter 521.

A pair of input terminals of the AND circuit 513 receives the control signal A and a mode signal MODE_AB as input, respectively. The AND circuit 513 outputs logical AND of the control signal A and the mode signal MODE_AB.

Here, the mode signal MODE_A is a signal for setting mode output from the control circuit 808 of the flash memory 800, and the mode signal MODE_AB is an inverted signal of the mode signal MODE_A inverted at the inverter 515, which is used for selecting a mode for supplying voltage from the node B to the node A. The control circuit 808 sets the mode signal MODE_A to L level when selecting the mode for supplying voltage from the node B to the node A. As a result, the mode signal MODE_A at L level is inverted by the inverter 515 to be the mode signal MODE_AB at H level, which is input into the AND circuit 513.

Therefore, the level shifters 511-521 transition into a state operational by the control signal A if the mode signal MODE_AB at H level is input into the AND circuit 513.

The AND circuit 514 is connected at input sides of the input terminal 512A of the level shifter 512 and the input terminal 522A of the level shifter 522, respectively. Namely, the output terminal of the AND circuit 514 is connected with the input terminal 512A of the level shifter 512 and the input terminal 522A of the level shifter 522.

A pair of input terminals of the AND circuit 514 receives the control signal A and a mode signal MODE_AB as input, respectively. The AND circuit 514 outputs logical AND of the control signal A and the mode signal MODE_AB.

Here, the mode signal MODE_A is a signal for setting mode output from the control circuit 808 of the flash memory 800, which is used for selecting a mode for supplying voltage from the node A to the node B, similarly to the first to fourth embodiments. The control circuit 808 sets the mode signal MODE_A to H level when selecting the mode for supplying voltage from the node A to the node B.

Therefore, the level shifters 512-522 transition into a state operational by the control signal A if the mode signal MODE_A at H level is input into the AND circuit 514.

The inverter 515 is connected with a wire that branches from the connection between the output terminal of the control circuit 808 and the other input terminal of AND circuit 514 (at the lower side in FIG. 15), and its input terminal is connected with the output terminal of the control circuit 808. The output terminal of the inverter 515 is connected with the other input terminal of AND circuit 513 (at the lower side in FIG. 15).

The inverter 515 determines the mode signal MODE_A output from the control circuit 808 to input it into the other input terminal of AND circuit 513 (at the lower side in FIG. 15) as the mode signal MODE_AB.

In the switching circuit 500 according to the fifth embodiment, if the mode signal MODE_A is at H level, the control signal A drives the level shifters 512-522, and the transistors SW3, SW4, SW5, and SW6 control the potential of the node BAK02.

In this case, the operation is substantially the same as that of the switching circuit 300 according to the third embodiment (see FIG. 12).

Also, if the mode signal MODE_A is at L level, the control signal A drives the level shifters 511-521, and the transistors SW7, SW8, SW9, and SW10 control the potential of the node BAK01 of the transistor SW1.

The mode signal MODE_A is set to L level when supplying voltage from the node B to the node A if the node B has higher potential than the node A. This is an operation which occurs, for example, when a write (PGM) operation of the flash memory 500 is completed and the potential of the node B is at 10 V, and the potential of the node B needs to be lowered to go back into the initial state for a read operation.

For example, when the node B is at 10 V, the node A is set to 5 V to output the mode signal MODE_A at L level from the control circuit 808. Then, when the control signal A rises to H level, the transistors SW1-SW2 turn on, the outputs of the level shifters 511-521 change, the switches SW9-SW10 turn on, and the potential of the node BAK01 is set to 10 V.

Further, the potential of the N well 51 (see FIG. 8A) of the transistor SW1 that takes the lower potential among the transistors SW1-SW2 becomes equivalent to the potential of the drain 54 of the transistor SW2, which prevents a parasitic bipolar transistor from becoming on that is formed by a PNP junction of the drain 54, the N well 51, and the p-type substrate 50.

In this way, the operation with the mode signal MODE_A at L level is a kind of operation in which the node A and the node B are reversed in the operation with the mode signal MODE_A at H level.

As above, the switching circuit 500 according to the fifth embodiment can suppress a forward bias that is applied between the source 56 (p region) and the N well 52 when the switching circuit 500 turns on if the node A has higher potential than the node B, which suppresses generation of a latchup.

Also, the switching circuit 500 according to the fifth embodiment can suppress a forward bias that is applied between the drain 54 (p region) and the N well 51 when the switching circuit 500 turns on if the node B has higher potential than the node A, which suppresses generation of a latchup.

Namely, the switching circuit 500 according to the fifth embodiment can suppress generation of a latchup for both cases where voltage is supplied from the node A to the node B, and voltage is supplied from the node B to the node A.

Therefore, an unforeseen situation can be prevented from happening in that the switching circuit 500 becomes uncontrollable due to a latchup.

Namely, compared with the conventional switching circuit 1 (see FIG. 1), the switching circuit 500 can improve operational reliability considerably by suppressing a latchup according to the fifth embodiment.

Also, the switching circuit 500 according to the first embodiment can suppress generation of a latchup without disposing a guard ring around the transistor SW2.

Also, the switching circuit 500 according to the first embodiment can suppress generation of a latchup without providing a power source circuit such as a charge pump or the like for complementing the current flowing between the drain of the transistor SW1 54 and the N well 51 or between the source 56 of the transistor SW2 and the N well 52.

Therefore, the switching circuit 500 according to the fifth embodiment can be made smaller because generation of a latchup can be suppressed effectively without increasing the area of an LSI.

As the switching circuit 500 is implemented as an LSI without increasing the LSI area, not only it can be made smaller, but also cost increase can also be suppressed because less semiconductor materials are used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A switching circuit comprising:
    a first well and a second well configured to be formed in a semiconductor substrate;
    a first transistor configured to be connected with a first node at one end of the first transistor, and the first transistor being formed in the first well;
    a second transistor configured to be connected with another end of the first transistor at one end of the second transistor, and connected with a second node at another end of the second transistor, and the second transistor being formed in the second well; and
    a potential control circuit configured to switch connection of the second well from the second node to the first node during a predetermined period including a period for the first transistor and the second transistor to transition from off to on in a state where a potential of the second node is lower than a potential of the first node, and to switch the connection of the second well from the first node to the second node after the predetermined period.

2. The switching circuit as claimed in claim 1, wherein the potential control circuit connects the second well with the second node before the predetermined period.

3. The switching circuit as claimed in claim 1, wherein the potential control circuit generates a second control signal having a pulse width of the predetermined period based on a first control signal.

4. The switching circuit as claimed in claim 3, wherein the potential control circuit includes:
    a third transistor, one end of which is connected with the first node,
    a fourth transistor, one end of which is connected with another end of the third transistor,
    a fifth transistor, one end of which is connected with another end of the fourth transistor,
    a sixth transistor, one end of which is connected with another end of the fifth transistor, and another end of the sixth transistor is connected with the second node, and
    a generating circuit configured to generate the second control signal based on the first control signal for turning on the first transistor and the second transistor,
    wherein a node connecting the fourth transistor with the fifth transistor is connected with the second well.

5. The switching circuit as claimed in claim 4, further comprising:
    a first voltage conversion circuit configured to be connected with the first node, and to control the first transistor based on the first control signal; and
    a second voltage conversion circuit configured to be connected with the second node, and to control the second transistor based on the first control signal;
    wherein the potential control circuit includes a third voltage conversion circuit configured to be connected with the first node, and to turn the third transistor on and the fifth transistor off based on the second control signal, a fourth voltage conversion circuit configured to be connected with the second node, and to turn the fourth transistor on and the sixth transistor off based on the second control signal.

6. The switching circuit as claimed in claim 5, wherein the generating circuit includes a delay element configured to invert the first control signal and to give a predetermined time of delay to the first control signal, and a logic circuit configured to output the second control signal by executing a logical operation on the signal output from the delay element and the first control signal.

7. The switching circuit as claimed in claim 5, wherein the generating circuit includes:
    a comparing part configured to compare the potential of the second node with a reference potential based on the first control signal,
    a first switch configured to be driven based on the first control signal,
    a second switch configured to be driven based on an output from the comparing part,
    a delay element configured to be connected with a connection point between the first switch and the second switch, and
    a logic circuit configured to output the second control signal by executing a logical operation on the first control signal and an output from the delay element.

8. The switching circuit as claimed in claim 5, wherein the first transistor and the second transistor are turned on for the predetermined period, the third transistor and the fourth transistor are turned on by the output of the first voltage conversion circuit and the second voltage conversion circuit, respectively, and the fifth transistor and the sixth transistor are turned off by the output of the first voltage conversion circuit and the second voltage conversion circuit, respectively.

9. The switching circuit as claimed in claim 8, wherein the potential control circuit further includes:
    a seventh transistor, one end of which is connected with the first node,
    an eighth transistor, one end of which is connected with another end of the seventh transistor,
    a ninth transistor, one end of which is connected with another end of the eighth transistor, and
    a tenth transistor, one end of which is connected with another end of the ninth transistor, and another end of the tenth transistor is connected with the second node,
    wherein a node connecting the eighth transistor with the ninth transistor is connected with the first well, and
    wherein, in a state where a potential of the first node is lower than a potential of the second node, the first transistor and the second transistor are turned on for the predetermined period, the ninth transistor and the tenth transistor are turned on by the outputs of the first voltage conversion circuit and the second voltage conversion circuit, respectively, and the seventh transistor and the eighth transistor are turned off by the outputs of the first voltage conversion circuit and the second voltage conversion circuit, respectively.

10. A switching circuit comprising:
a first well configured to be formed in a semiconductor substrate;
a second well configured to be formed in the semiconductor substrate;
a first transistor configured to be connected with a first node at one end of the first transistor, and the first transistor being formed in the first well;
a second transistor configured to be connected with another end of the first transistor at one end of the second transistor, and connected with a second node at another end of the second transistor, and the second transistor being formed in the second well; and
a potential control circuit configured to switch connection of the second well from the second node to the first node during a predetermined period including a period for the first transistor and the second transistor to transition from off to on in a state where a potential of the second node is lower than a potential of the first node.

11. A semiconductor memory device comprising:
the switching circuit as claimed in claim 1; and
a memory cell configured to have data to be read or written by a signal having been through the switching circuit.

12. The semiconductor memory device as claimed in claim 11, wherein a state where the potential of the second node is lower than the potential of the first node is a state before the data is written into the memory cell.

13. The switching circuit as claimed in claim 10, wherein the potential control circuit connects the second well with the second node before the predetermined period.

14. The switching circuit as claimed in claim 10, wherein the potential control circuit generates a second control signal having a pulse width of the predetermined period based on a first control signal.

15. The switching circuit as claimed in claim 14, wherein the potential control circuit includes:
a third transistor, one end of which is connected with the first node,
a fourth transistor, one end of which is connected with another end of the third transistor,
a fifth transistor, one end of which is connected with another end of the fourth transistor,
a sixth transistor, one end of which is connected with another end of the fifth transistor, and another end of the sixth transistor is connected with the second node, and
a generating circuit configured to generate the second control signal based on the first control signal for turning on the first transistor and the second transistor,
wherein a node connecting the fourth transistor with the fifth transistor is connected with the second well.

* * * * *